(12) United States Patent
Mochizuki

(10) Patent No.: US 12,313,459 B2
(45) Date of Patent: May 27, 2025

(54) PHOTODETECTION DEVICE AND PHOTODETECTOR

(71) Applicant: Sony Semiconductor Solutions Corporation, Kanagawa (JP)

(72) Inventor: Futa Mochizuki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/579,661

(22) PCT Filed: Mar. 3, 2022

(86) PCT No.: PCT/JP2022/009162
§ 371 (c)(1),
(2) Date: Jan. 16, 2024

(87) PCT Pub. No.: WO2023/026524
PCT Pub. Date: Mar. 2, 2023

(65) Prior Publication Data
US 2024/0328854 A1  Oct. 3, 2024

(30) Foreign Application Priority Data
Aug. 26, 2021 (JP) .................... 2021-138211

(51) Int. Cl.
*G01J 1/44* (2006.01)
(52) U.S. Cl.
CPC ..................... *G01J 1/44* (2013.01)
(58) Field of Classification Search
CPC ......... G01J 1/44; H04N 25/53; H04N 25/445; H04N 25/707; H04N 25/673; H04N 25/77; H04N 23/957; H04N 25/47; H04N 5/3655; H04N 5/353
See application file for complete search history.

(56) References Cited

U.S. PATENT DOCUMENTS

2016/0223884 A1 * 8/2016 Kususaki ............. H04N 25/633
2020/0358977 A1 * 11/2020 Niwa ................ H01L 27/14609

FOREIGN PATENT DOCUMENTS

| JP | 2017050853 A | 3/2017 |
| JP | 2020088723 A | 6/2020 |
| JP | 2021040294 A | 3/2021 |
| WO | 2021039142 A1 | 3/2021 |

OTHER PUBLICATIONS

International Search Report (PCT/ISA/210), International Application No. PCT/JP2022/009162, dated May 17, 2022.

* cited by examiner

*Primary Examiner* — Georgia Y Epps
*Assistant Examiner* — Don J Williams
(74) *Attorney, Agent, or Firm* — Michael Best & Friedrich LLP

(57) ABSTRACT

A photodetection device of the present disclosure includes: a plurality of pixels each including a light-receiving element, a generation circuit configured to generate a light-receiving signal corresponding to an amount of light received by the light-receiving element, and a change detection circuit configured to detect an amount of a change in the light-receiving signal; a selector circuit configured to couple one of a plurality of the change detection circuits in the plurality of pixels to a coupling node; a bias circuit coupled to the coupling node; and a comparison circuit configured to generate an event signal by comparing a signal in the coupling node and a predetermined threshold with each other.

20 Claims, 22 Drawing Sheets

[FIG. 1]
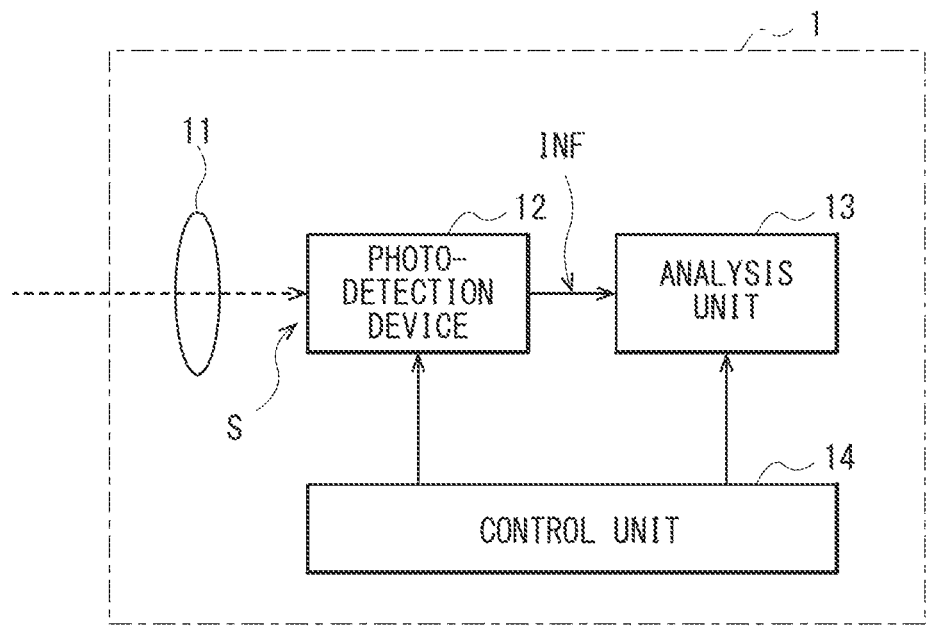
[FIG. 2]
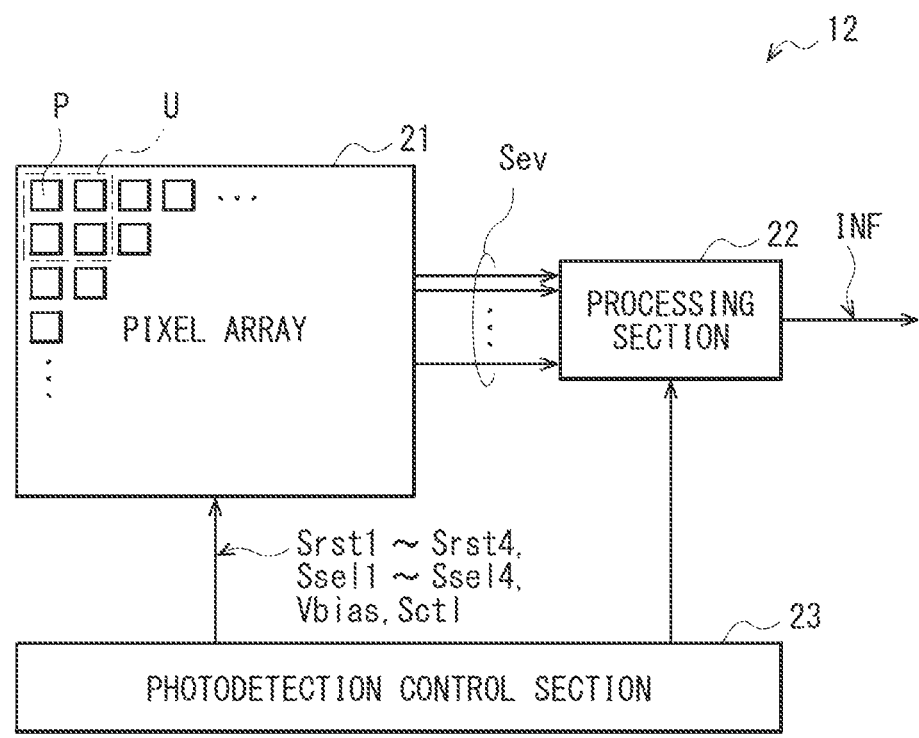

[FIG. 3]
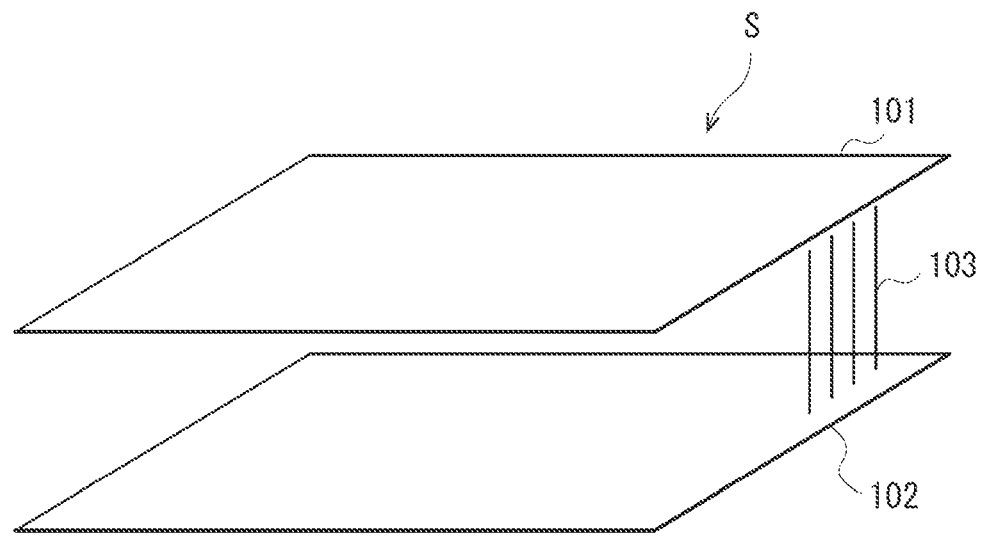

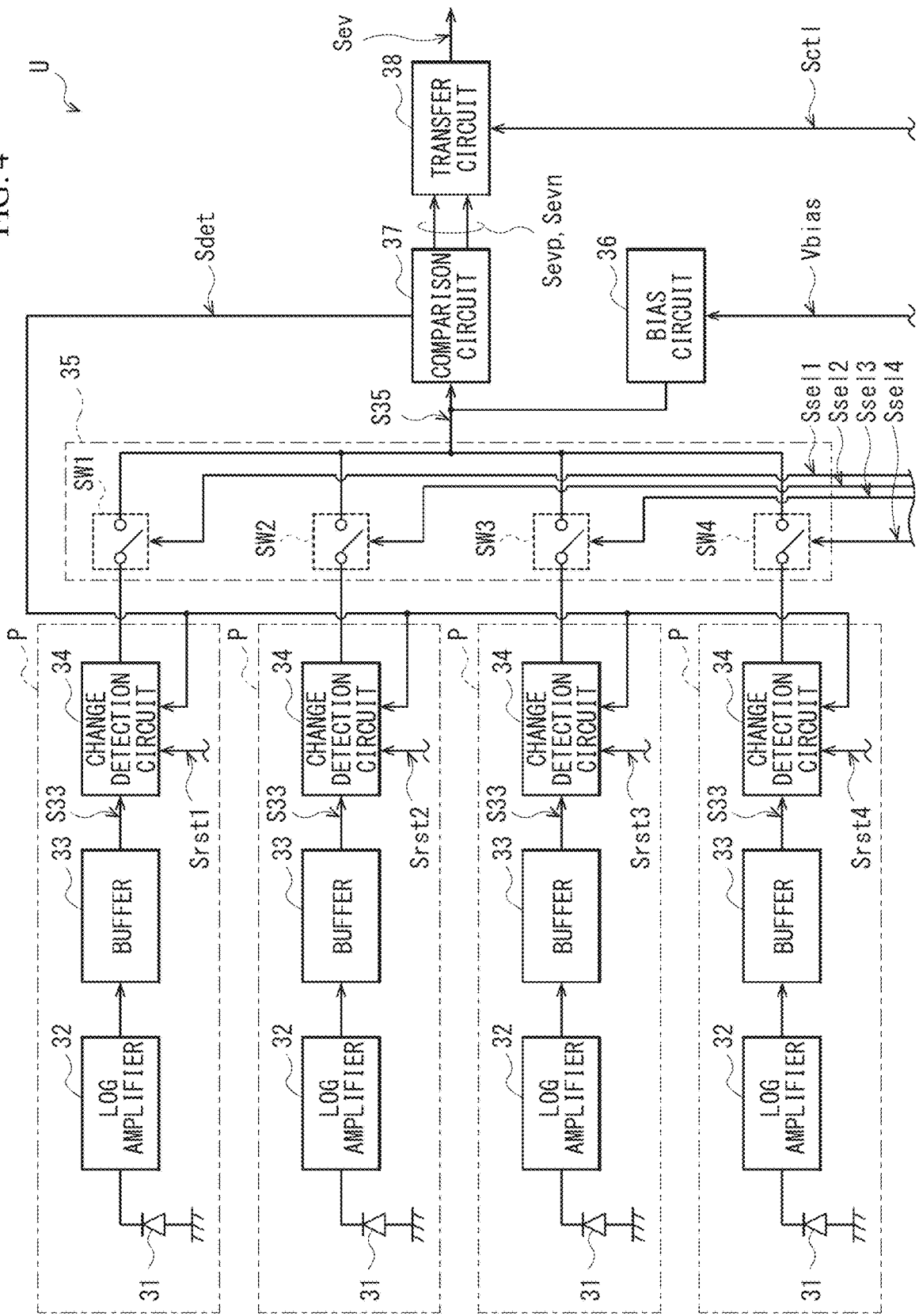

[FIG.5]
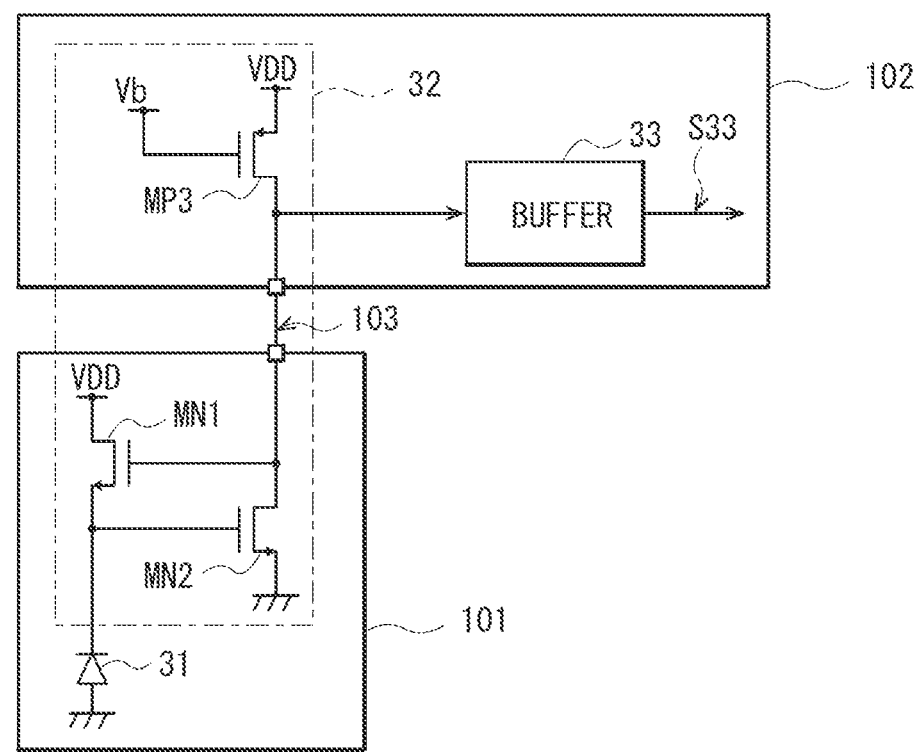

[FIG. 7]
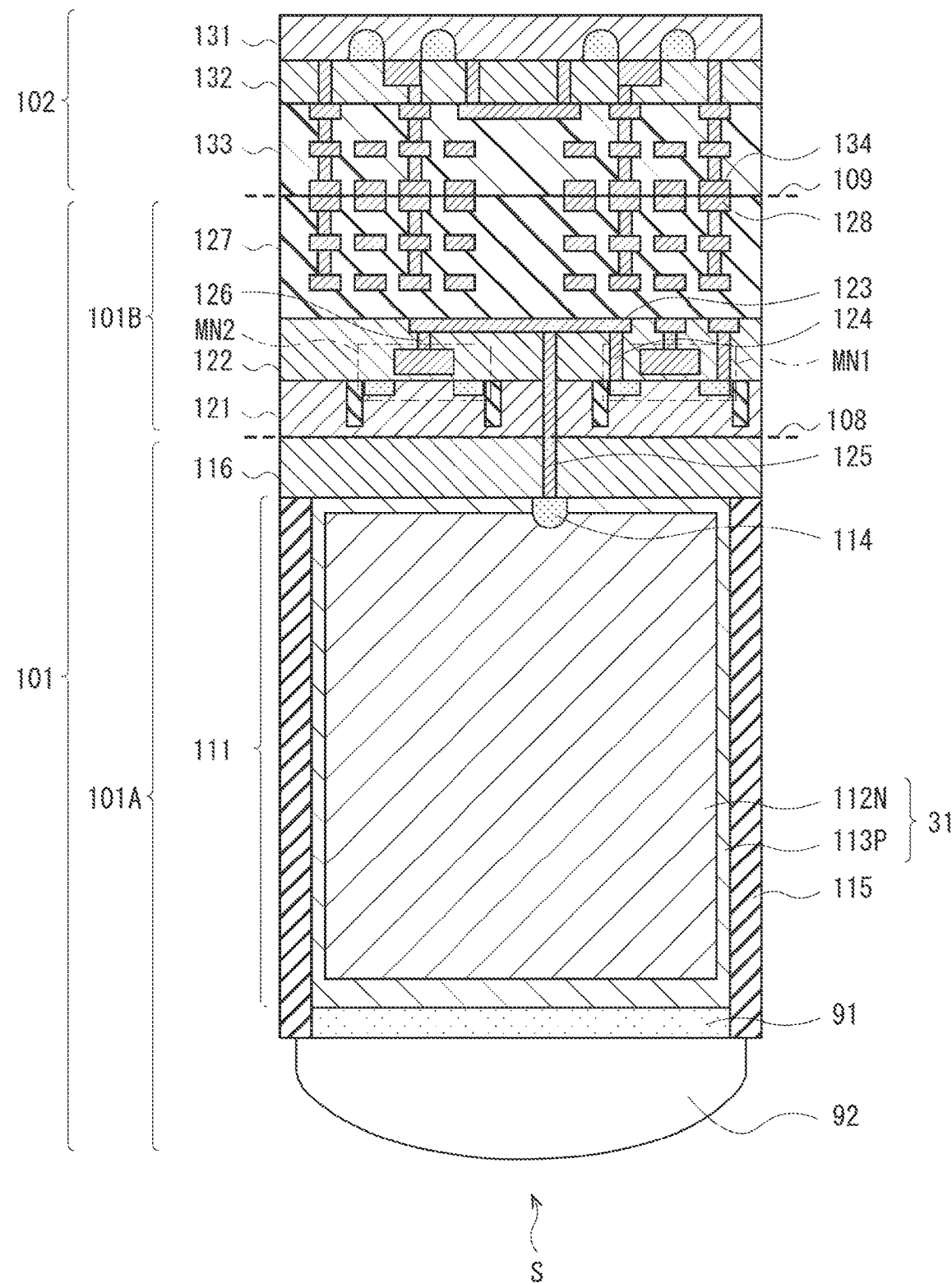

[FIG.8]
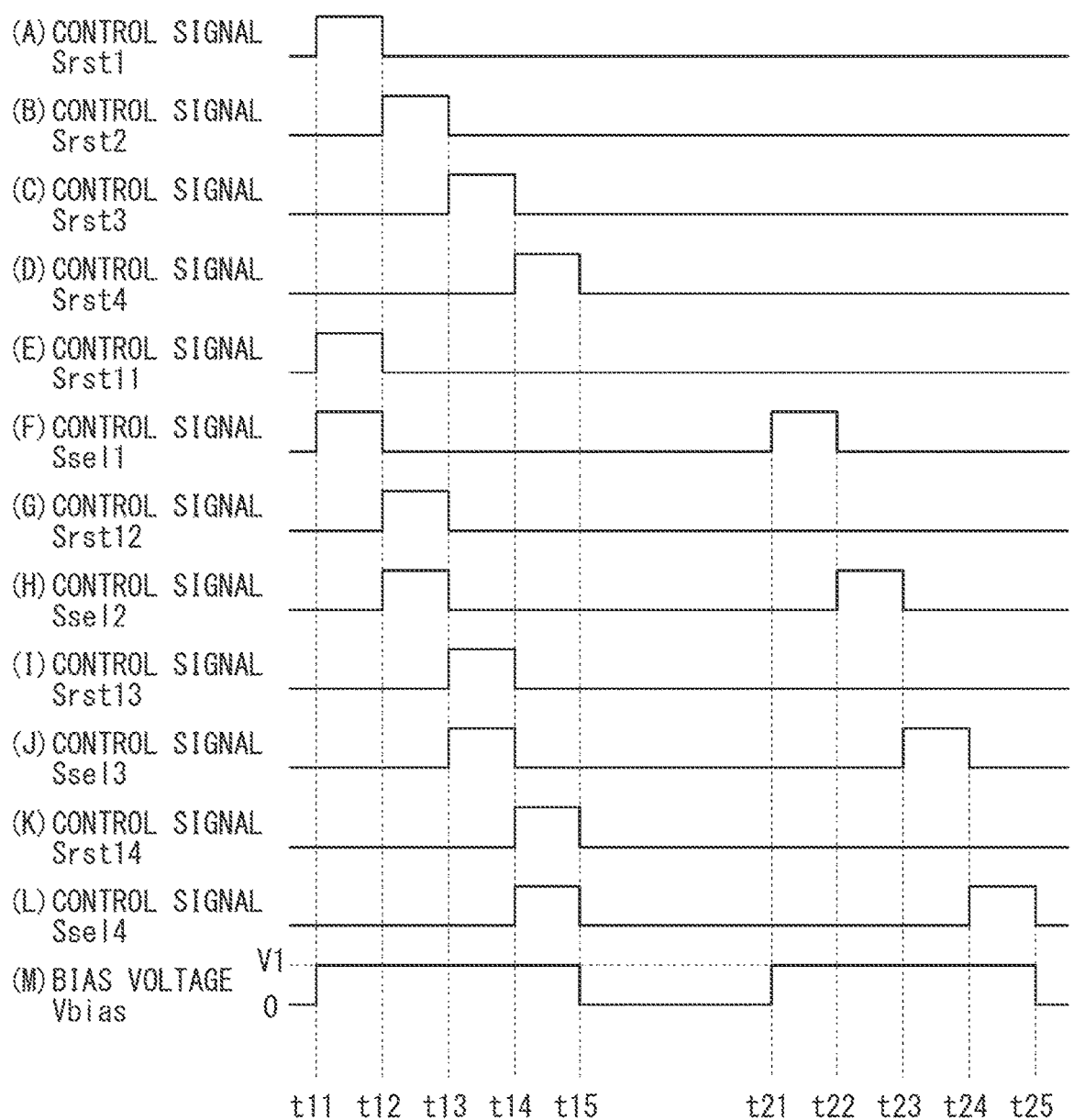

[FIG. 9A]
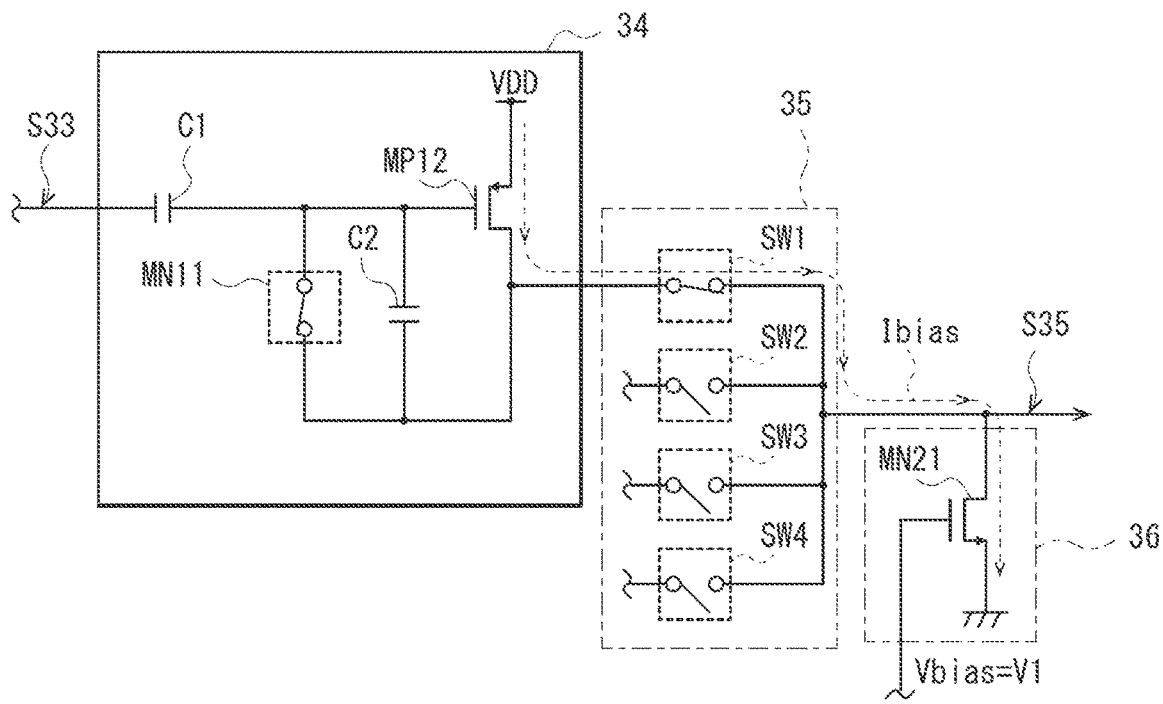
[FIG. 9B]
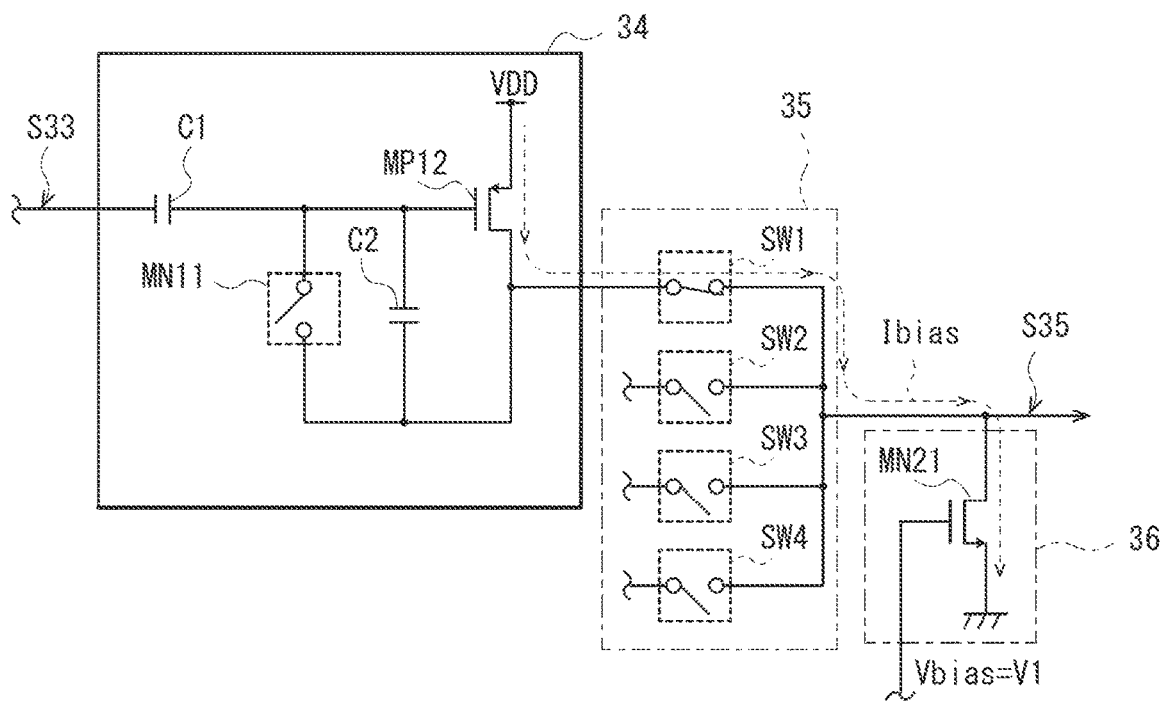

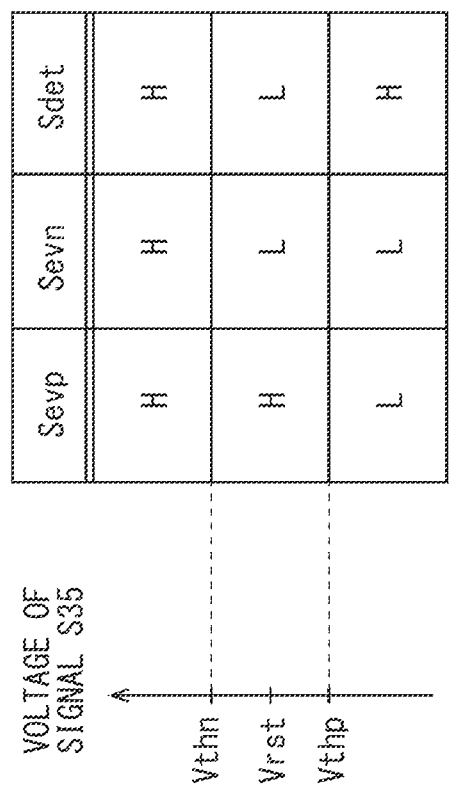
[ FIG. 10 ]

[ FIG. 23 ]
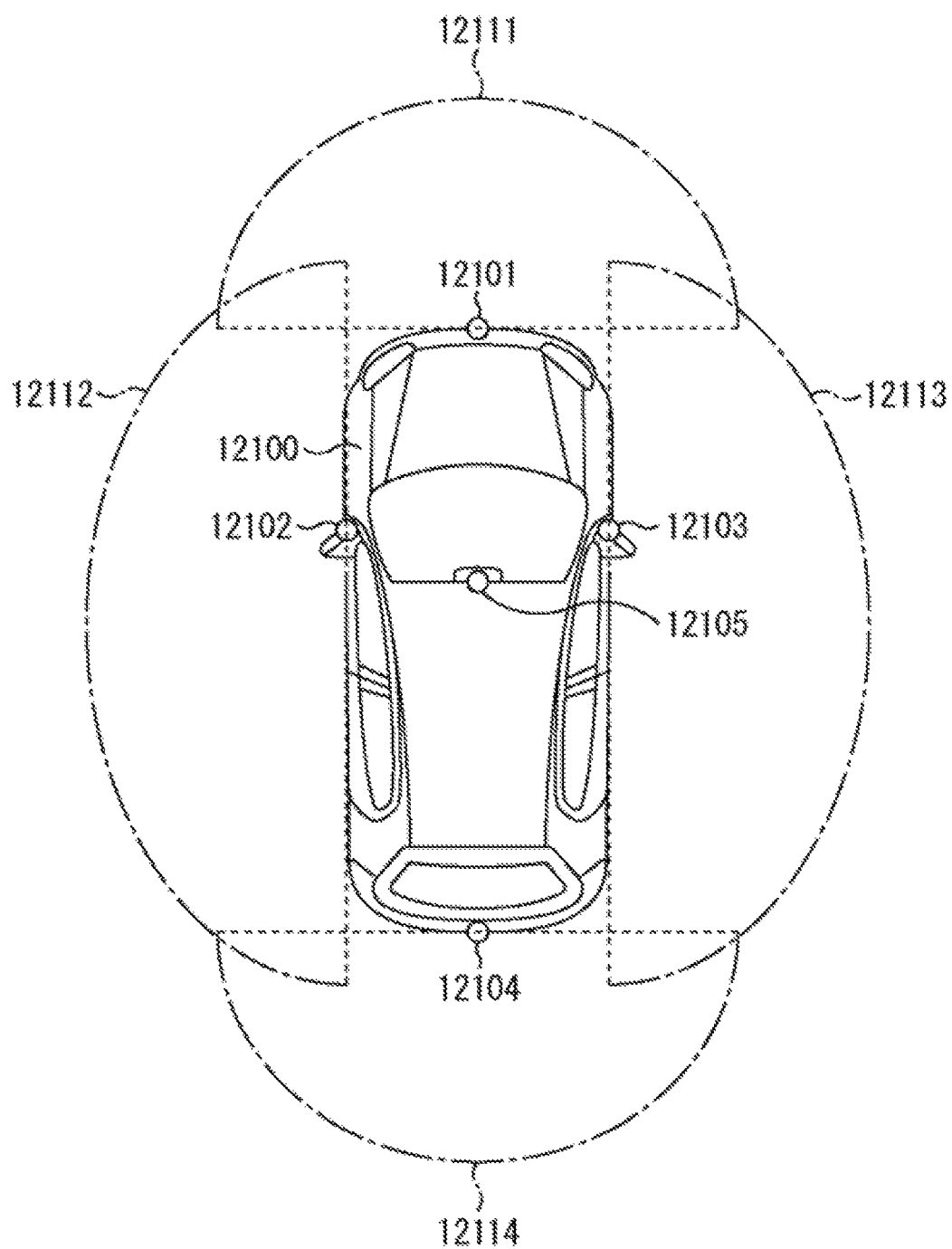

PHOTODETECTION DEVICE AND PHOTODETECTOR

TECHNICAL FIELD

The present disclosure relates to a photodetection device and a photodetector that generate an event signal on the basis of a result of detected light.

BACKGROUND ART

In a so-called dynamic vision sensor, an event signal is generated on the basis of a result of light received by a photodiode, and image data is generated on the basis of this event signal (for example, PTL1).

CITATION LIST

Patent Literatures

PTL 1: International Publication No. WO2021/039142

SUMMARY OF INVENTION

Incidentally, a photodetection device is desired to be small in pixel size, and further size reduction is expected of the photodetection device.

It is desirable to provide a photodetection device and a photodetector that allow the pixel size to be smaller.

A photodetection device according to an embodiment of the present disclosure includes a plurality of pixels, a selector circuit, a bias circuit, and a comparison circuit. The plurality of pixels each include a light-receiving element, a generation circuit configured to generate a light-receiving signal corresponding to an amount of light received by the light-receiving element, and a change detection circuit configured to detect an amount of a change in the light-receiving signal. The selector circuit is configured to couple one of a plurality of the change detection circuits in the plurality of pixels to a coupling node. The bias circuit is coupled to the coupling node. The comparison circuit is configured to generate an event signal by comparing a signal in the coupling node and a predetermined threshold with each other.

A photodetector according to an embodiment of the present disclosure includes an optical system, a photodetection device, and an analysis circuit. The photodetection device is configured to detect light incident through the optical system. The analysis circuit is configured to analyze an object to be detected on the basis of a result of detection by the photodetection device. The photodetection device includes a plurality of pixels, a selector circuit, a bias circuit, and a comparison circuit. The plurality of pixels each include a light-receiving element, a generation circuit configured to generate a light-receiving signal corresponding to an amount of light received by the light-receiving element, and a change detection circuit configured to detect an amount of a change in the light-receiving signal. The selector circuit is configured to couple one of a plurality of the change detection circuits in the plurality of pixels to a coupling node. The bias circuit is coupled to the coupling node. The comparison circuit is configured to generate an event signal by comparing a signal in the coupling node and a predetermined threshold with each other.

In the photodetection device and the photodetector of an embodiment of the present disclosure, in each of the plurality of pixels, a light-receiving signal corresponding to an amount of light received by the light-receiving element is generated by the generation circuit, and an amount of a change in this light-receiving signal is detected by the change detection circuit. One of the plurality of the change detection circuits in the plurality of pixels is coupled by the selector circuit to the coupling node to which the bias circuit is coupled. The comparison circuit coupled to this coupling node generates an event signal by comparing a signal in the coupling node and the predetermined threshold with each other.

BRIEF DESCRIPTION OF DRAWINGS

FIG. 1 is a block diagram illustrating a configuration example of a photodetector according to an embodiment of the present disclosure.

FIG. 2 is a block diagram illustrating a configuration example of a photodetection device illustrated in FIG. 1.

FIG. 3 is an explanatory diagram illustrating an implementation example of the photodetection device illustrated in FIG. 2.

FIG. 4 is a block diagram illustrating a configuration example of a unit illustrated in FIG. 2.

FIG. 5 is a circuit diagram illustrating a configuration example of a LOG amp illustrated in FIG. 4.

FIG. 7 is a cross-sectional view illustrating an implementation example of the photodetection device illustrated in FIG. 2.

FIG. 8 is a waveform timing diagram illustrating an operation example of the change detection circuits, a selector circuit, and a bias circuit illustrated in FIG. 6.

FIG. 9A is an explanatory diagram illustrating respective operating states of the change detection circuits, the selector circuit, and the bias circuit illustrated in FIG. 6.

FIG. 9B is an explanatory diagram illustrating the other operating states of the change detection circuit, the selector circuit, and the bias circuit illustrated in FIG. 6.

FIG. 10 is an explanatory diagram illustrating an operation example of a comparison circuit illustrated in FIG. 6.

FIG. 23 is an explanatory diagram illustrating an example of an installation position of an imaging unit.

MODES FOR CARRYING OUT THE INVENTION

Figure 6:
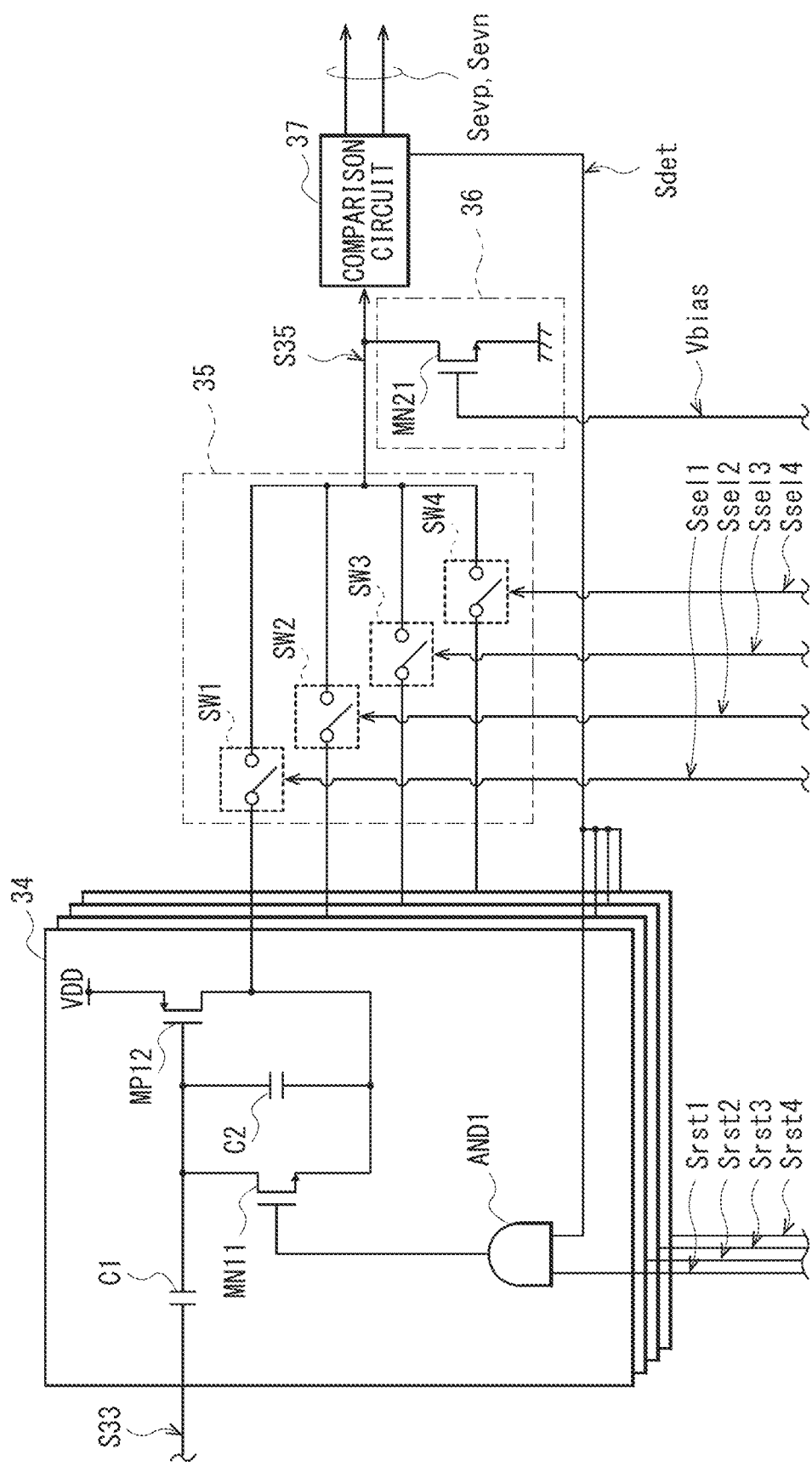
FIG. 6 is a circuit diagram illustrating a configuration example of a change detection circuit illustrated in FIG. 4.

With reference to the drawings, some embodiments of the present disclosure will be described in detail below. It is to be noted that the description will be given in the following order.

1. Embodiment
2. Example of Practical Application to Mobile Body

1. Embodiment

[Configuration Example]

FIG. 1 illustrates a configuration example of a photodetector 1 including a photodetection device according to an embodiment. The photodetector 1 includes an optical system 11, a photodetection device 12, an analysis unit 13, and a control unit 14.

The optical system 11 includes a lens that collects incident light and forms it as an image on a light-receiving surface S of the photodetection device 12.

The photodetection device 12 is configured to detect light incident on the light-receiving surface S and, on the basis of its detection result, generate detection information INF including information about the position of a pixel P where an event has occurred.

The analysis unit 13 is configured to analyze an object to be detected by the photodetector 1 on the basis of the detection information INF. For example, the analysis unit 13 is able to recognize an object to be detected by the photodetector 1 or to perform a process of detecting the movement of the object to be detected. The analysis unit 13 includes, for example, a processor, a memory, etc., and executes software thereby performing a process using a neural network.

The control unit 14 is configured to control the operations of the photodetection device 12 and the analysis unit 13.

FIG. 2 illustrates a configuration example of the photodetection device 12. The photodetection device 12 includes a pixel array 21, a processing section 22, and a photodetection control section 23. In this example, the photodetection device 12 includes two semiconductor chips.

FIG. 3 illustrates an implementation example of the photodetection device 12. In this example, the photodetection device 12 includes two semiconductor chips 101 and 102. The semiconductor chip 101 is disposed on the side of the light-receiving surface S in the photodetection device 12, and the semiconductor chip 102 is disposed on the side opposite to the light-receiving surface S of the photodetection device 12. The semiconductor chips 101 and 102 are stacked on top of each other. Respective wiring lines of the semiconductor chips 101 and 102 are coupled by a wiring line 103. As the wiring line 103, for example, bonding of metal, such as Cu—Cu bonding, bump bonding, or the like is able to be used.

The pixel array 21 (FIG. 2) includes a plurality of pixels P arranged in a matrix. The pixel P includes a photodiode, and the pixel array 21 is configured to generate an event signal Sev according to the presence or absence of an event on the basis of a result of light received by this photodiode. Four pixels P constitute a unit U. In the unit U, the four pixels P are arranged in a matrix of two rows and two columns. In the pixel array 21, such units U are provided side by side.

FIG. 4 illustrates a configuration example of the unit U. In this example, the unit U includes four pixels P, a selector circuit 35, a bias circuit 36, a comparison circuit 37, and a transfer circuit 38.

The four pixels P each include a photodiode 31, an LOG amplifier 32, a buffer 33, and a change detection circuit 34.

The photodiode 31 is a photoelectric conversion element that generates an amount of electric charge corresponding to an amount of light received. An anode of the photodiode 31 is grounded, and a cathode is coupled to an input terminal of the LOG amplifier 32. The photodiode 31 is formed in the semiconductor chip 101 (FIG. 3).

The LOG amplifier 32 is configured to convert a current corresponding to the amount of light received by the photodiode 31 into a voltage. The input terminal of the LOG amplifier 32 is coupled to the cathode of the photodiode 31, and an output terminal is coupled to an input terminal of the buffer 33. The LOG amplifier 32 is formed extending over the semiconductor chip 101 and the semiconductor chip 102 (FIG. 3).

FIG. 5 illustrates a configuration example of the LOG amplifier 32. In this FIG. 5, the photodiode 31 and the buffer 33 are also illustrated. The LOG amplifier 32 includes transistors MN1, MN2, and MP3. The transistors MN1 and MN2 are N-type MOS (metal oxide semiconductor) transistors, and the transistor MP3 is a P-type MOS transistor. In this example, the transistors MN1 and MN2 are formed in the semiconductor chip 101, and the transistor MP3 is formed in the semiconductor chip 102.

A gate of the transistor MN1 is coupled to a drain of the transistor MN2 and is also coupled to a drain of the transistor MP3 and the input terminal of the buffer 33 through the wiring line 103 between the semiconductor chips 101 and 102, a drain is supplied with a power supply voltage VDD, and a source is coupled to a gate of the transistor MN2 and the cathode of the photodiode 31. The gate of the transistor MN2 is coupled to the source of the transistor MN1 and the cathode of the photodiode 31, the drain is coupled to the gate of the transistor MN1 and is also coupled to the drain of the transistor MP3 and the input terminal of the buffer 33 through the wiring line 103 between the semiconductor chips 101 and 102, and a source is grounded. A gate of the transistor MP3 is supplied with a bias voltage Vb, a source is supplied with the power supply voltage VDD, and the drain is coupled to the input terminal of the buffer 33 and is also coupled to the gate of the transistor MN1 and the drain of the transistor MN2 through the wiring line 103 between the semiconductor chips 101 and 102.

This configuration allows the LOG amplifier 32 to convert a current flowing through the photodiode 31 into a voltage using a logarithmic characteristic of the transistor MN1, thereby generating a voltage signal corresponding to an amount of light received and supplying the generated voltage signal to the buffer 33.

The buffer 33 (FIGS. 4 and 5) has a high input impedance and a low output impedance, and is configured to output a signal S33 according to the voltage signal supplied from the LOG amplifier 32. The input terminal of the buffer 33 is coupled to the output terminal of the LOG amplifier 32, and an output terminal is coupled to an input terminal of the change detection circuit 34. The buffer 33 includes, for example, a source follower circuit. The buffer 33 is formed in the semiconductor chip 102 (FIG. 3).

The change detection circuit 34 (FIG. 4) is configured to detect a change amount of the signal S33 supplied from the buffer 33. The four change detection circuits 34 in the unit U are supplied with a control signal Sdet from the comparison circuit 37, and are supplied with different control signals Srst (control signals Srst1, Srst2, Srst3, and Srst4) from the photodetection control section 23. The change detection circuit 34 is formed in the semiconductor chip 102 (FIG. 3).

FIG. 6 illustrates a configuration example of the change detection circuit 34. In this FIG. 6, the selector circuit 35, the bias circuit 36, and the comparison circuit 37 are also illustrated.

The change detection circuit 34 includes a capacitor C1, transistors MN11 and MP12, a capacitor C2, and an AND circuit AND1. The transistor MN11 is an N-type MOS transistor, and the transistor MP12 is a P-type MOS transistor.

One end of the capacitor C1 is supplied with the signal S33 from the buffer 33, and the other end is coupled to a drain of the transistor MN11, a gate of the transistor MP12, and one end of the capacitor C2. A gate of the transistor MN11 is coupled to an output terminal of the AND circuit AND1, the drain is coupled to the other end of the capacitor C1, the one end of the capacitor C2, and the gate of the transistor MP12, and a source is coupled to a drain of the transistor MP12, the other end of the capacitor C2, and the selector circuit 35. The gate of the transistor MP12 is coupled to the other end of the capacitor C1, the drain of the transistor MN11, and the one end of the capacitor C2, a source is supplied with the power supply voltage VDD, and the drain is coupled to the source of the transistor MN11, the other end of the capacitor C2, and the selector circuit 35. The one end of the capacitor C2 is coupled to the other end of the capacitor C1, the drain of the transistor MN11, and the gate of the transistor MP12, and the other end is coupled to the source of the transistor MN11, the drain of the transistor MP12, and the selector circuit 35. The AND circuit AND1 is a 2-input AND circuit, and a first input terminal is supplied with the control signal Srst from the photodetection control section 23, a second input terminal is supplied with the control signal Sdet from the comparison circuit 37, and the output terminal is coupled to the gate of the transistor MN11.

The four change detection circuits 34 are sequentially coupled to the bias circuit 36 by the selector circuit 35. The change detection circuit 34 operates by being coupled to the bias circuit 36 through the selector circuit 35, and detects a change amount of the signal S33 supplied from the buffer 33.

The selector circuit 35 (FIGS. 4 and 6) is configured to sequentially couple one of the four change detection circuits 34 to the bias circuit 36 and the comparison circuit 37 on the basis of control signals Ssel1, Ssel2, Ssel3, and Ssel4 supplied from the photodetection control section 23. The selector circuit 35 includes four switches SW1, SW2, SW3, and SW4. The four switches SW1, SW2, SW3, and SW4 are provided to correspond to the four change detection circuits 34. The switch SW1 is configured to couple its corresponding change detection circuit 34 to the bias circuit 36 and the comparison circuit 37 on the basis of the control signal Ssel1. The switch SW2 is configured to couple its corresponding change detection circuit 34 to the bias circuit 36 and the comparison circuit 37 on the basis of the control signal Ssel2. The switch SW3 is configured to couple its corresponding change detection circuit 34 to the bias circuit 36 and the comparison circuit 37 on the basis of the control signal Ssel3. The switch SW4 is configured to couple its corresponding change detection circuit 34 to the bias circuit 36 and the comparison circuit 37 on the basis of the control signal Ssel4. The selector circuit 35 is formed in the semiconductor chip 102 (FIG. 3).

The bias circuit 36 (FIGS. 4 and 6) is configured to operate as a bias circuit of the four change detection circuits 34. As illustrated in FIG. 6, the bias circuit 36 includes a transistor MN21. The transistor MN21 is an N-type MOS transistor, and a gate is supplied with a bias voltage Vbias from the photodetection control section 23, a drain is coupled to an output terminal of the selector circuit 35 and an input terminal of the comparison circuit 37, and a source is grounded. The bias circuit 36 is formed in the semiconductor chip 102 (FIG. 3).

The four change detection circuits 34 sequentially operate by being sequentially coupled to the bias circuit 36 through the selector circuit 35, and sequentially output a signal corresponding to a change amount of the input signal S33. Therefore, the input terminal of the comparison circuit 37 has a signal S35 including signals corresponding to respective change amounts of four signals S33 inputted to the four change detection circuits 34. In other words, the signal S35 includes signals corresponding to respective change amounts of the amounts of light received in the four pixels P.

The comparison circuit 37 (FIGS. 4 and 6) is configured to perform a comparison operation on the basis of the signal S35, thereby generating event signals Sevp and Sevn corresponding to the presence or absence of an event. Specifically, the comparison circuit 37 generates an event signal Sevp by comparing a voltage of the signal S35 and a predetermined threshold voltage Vthp with each other, and generates an event signal Sevn by comparing the voltage of the signal S35 and a predetermined threshold voltage Vthn with each other. As described above, the signal S35 includes signals corresponding to respective change amounts of the amounts of light received in the four pixels P. Therefore, the comparison circuit 37 detects an event by checking whether the change amount of the amount of light received is equal to or more than a predetermined amount, and generates event signals Sevp and Sevn corresponding to the presence or absence of the event. The event signals Sevp and Sevn may be output, for example, through two signal lines, or may be time-sharedly output through one signal line. Furthermore, in a case where the change amount of the amount of light received is equal to or more than the predetermined amount, the comparison circuit 37 also performs an operation to generate a control signal Sdet that becomes high level regardless of a change in polarity. The comparison circuit 37 is formed in the semiconductor chip 102 (FIG. 3).

The transfer circuit 38 (FIG. 4) is configured to output the event signals Sevp and Sevn as an event signal Sev on the basis of a control signal Sctl supplied from the photodetection control section 23. The transfer circuit 38 is formed in the semiconductor chip 102 (FIG. 3).

The processing section 22 (FIG. 2) is configured to generate detection information INF including information about the position of a pixel P where the change amount of the amount of light received is equal to or more than the predetermined amount on the basis of multiple event signals Sev supplied from the pixel array 21. The processing section 22 is formed in the semiconductor chip 102 (FIG. 3).

The photodetection control section 23 is configured to control the operations of the pixel array 21 and the processing section 22. The photodetection control section 23 is formed in the semiconductor chip 102 (FIG. 3).

FIG. 7 illustrates an example of a cross-section structure of the photodetection device 12. This FIG. 7 illustrates a cross-section structure on a surface intersecting with the light-receiving surface S of the photodetection device 12. In this example, the photodetection device 12 includes the semiconductor chips 101 and 102, and the semiconductor chip 101 includes two semiconductor chips 101A and 101B. The semiconductor chips 101A, 101B, and 102 are stacked in this order. The semiconductor chips 101A and 101B are bonded by a bonding surface 108, and the semiconductor chips 101B and 102 are bonded by a bonding surface 109.

The semiconductor chip 101A includes a semiconductor substrate 111, an insulating film 116, a planarization film 91, and an on-chip lens 92.

In the semiconductor substrate 111, an N-type semiconductor region 112N, a P-type semiconductor region 113P, a contact 114, and a pixel separation section 115 are formed. The N-type semiconductor region 112N and the P-type semiconductor region 113P are provided in a region of the semiconductor substrate 111 corresponding to the pixels P, and constitute the photodiode 31. The N-type semiconductor region 112N corresponds to the cathode of the photodiode 31, and the P-type semiconductor region 113P corresponds to the anode of the photodiode 31. The P-type semiconductor region 113P is formed to surround the N-type semiconductor region 112N. For example, the impurity concentration of, within the P-type semiconductor region 113P, a portion (an upper portion in FIG. 7) on the side opposite to the light-receiving surface S is able to be higher than the impurity concentration of a portion (a lower portion in FIG. 7) on the side of the light-receiving surface S. The contact 114 is configured to make it possible to take an electric charge from the N-type semiconductor region 112N. The pixel separation section 115 is provided to electrically and optically isolate the pixels P in the semiconductor substrate 111. The pixel separation section 115 is formed into a two-dimensional grid as viewed from a back surface (a lower surface in FIG. 7) of the semiconductor chip 101.

The insulating film 116 is configured to electrically isolate the semiconductor chips 101A and 101B, and is formed on a front surface (an upper surface in FIG. 7) of the semiconductor substrate 111. A surface of this insulating film 116 on the side of the bonding surface 108 is planarized to be bonded to the semiconductor chip 101B.

The planarization film 91 is formed on a back surface (a lower surface in FIG. 7) of the semiconductor substrate 111. The on-chip lens 92 is provided on the planarization film 91 to correspond to the pixels P. A surface of the photodetection device 12 with the on-chip lens 92 formed thereon is the light-receiving surface S.

By this configuration, light incident through the on-chip lens 92 is subjected to photoelectric conversion by the photodiode 31. An electric charge generated by the photoelectric conversion is accumulated in the N-type semiconductor region 112N, and is taken from the contact 114 to the semiconductor chip 101B.

The semiconductor chip 101B includes a semiconductor substrate 121, an insulating film 122, and a wiring layer 127.

In the semiconductor substrate 121, the transistors MN1 and MN2 of the LOG amplifier 32 are formed. The insulating film 122 is formed on the semiconductor substrate 121 in a front surface (an upper surface in FIG. 7) of the semiconductor chip 101B. The source of the transistor MN1 and the gate of the transistor MN2 are coupled to the contact 114 provided in the semiconductor chip 101A. Specifically, the source of the transistor MN1 is coupled to the contact 114 through a via 124, a wiring line 123 formed on an upper surface of the insulating film 122, and a through via 125 that goes through the semiconductor substrate 121. The through via 125 is a so-called through silicon via (TSV). Furthermore, the gate of the transistor MN2 is coupled to the contact 114 through a via 126, the wiring line 123, and the through via 125.

The wiring layer 127 includes an insulating layer and multiple layers of wiring lines. A plurality of pads 128 is formed on a surface of the wiring layer 127 on the side of the bonding surface 109. These pads 128 include, for example, copper (Cu). One of the pads 128 is coupled to, for example, the gate of the transistor MN1 and the drain of the transistor MN2 through wiring lines of the wiring layer 127.

The semiconductor chip 102 includes a semiconductor substrate 131, an insulating film 132, and a wiring layer 133.

In the semiconductor substrate 131, the transistor MP3 of the LOG amplifier 32, the buffer 33, the change detection circuit 34, the selector circuit 35, the bias circuit 36, the comparison circuit 37, the transfer circuit 38, the processing section 22, and the photodetection control section 23 are formed. The insulating film 132 is formed on a front surface (a lower surface in FIG. 7) of the semiconductor substrate 131.

The wiring layer 133 includes an insulating layer and multiple layers of wiring lines. A plurality of pads 134 is formed on a surface of the wiring layer 133 on the side of the bonding surface 109. These pads 134 are formed using, for example, copper (Cu). The pads 128 and 134 disposed across the bonding surface 109 constitute Cu—Cu bonding.

The plurality of pixels P here corresponds to a specific example of a "plurality of pixels" in the present disclosure. The photodiode 31 corresponds to a specific example of a "light-receiving element" in the present disclosure. The LOG amplifier 32 and the buffer 33 correspond to a specific example of a "generation circuit" in the present disclosure. The change detection circuit 34 corresponds to a specific example of a "change detection circuit" in the present disclosure. The selector circuit 35 corresponds to a specific example of a "selector circuit" in the present disclosure. The bias circuit 36 corresponds to a specific example of a "bias circuit" in the present disclosure. The comparison circuit 37 corresponds to a specific example of a "comparison circuit" in the present disclosure. The transistor MN21 corresponds to a specific example of a "first transistor" in the present disclosure. The photodetection control section 23 corresponds to a specific example of a "control circuit" in the present disclosure. The capacitor C1 corresponds to a specific example of a "first capacitor" in the present disclosure. The capacitor C2 corresponds to a specific example of a "second capacitor" in the present disclosure. The transistor MP12 corresponds to a specific example of a "third transistor" in the present disclosure. The transistor MN11 corresponds to a specific example of a "fourth transistor" in the present disclosure. The semiconductor chip 101 corresponds to a specific example of a "first semiconductor chip" in the present disclosure. The semiconductor chip 102 corresponds to a specific example of a "second semiconductor chip" in the present disclosure.

[Operations and Workings]

Subsequently, the operation and working of the photodetector 1 of the present embodiment are described.

(Outline of Overall Operation)

First, an outline of the overall operation of the photodetector 1 is described with reference to FIGS. 1 and 2.

The lens of the optical system 11 collects incident light and forms it as an image on the light-receiving surface S of the photodetection device 12. The photodetection device 12 detects light incident on the light-receiving surface S and, on the basis of its detection result, generates detection information INF including information about the position of a pixel P where an event has occurred. The analysis unit 13 analyzes an object to be detected by the photodetector 1 on the basis of the detection information INF. The control unit 14 controls the operations of the photodetection device 12 and the analysis unit 13.

In the photodetection device 12, the pixel array 21 generates an event signal Sev corresponding to the presence or absence of an event on the basis of a result of light received by the photodiode 31. The processing section 22 (FIG. 2) generates detection information INF including information about the position of a pixel P where an event has occurred on the basis of multiple event signals Sev supplied from the pixel array 21. The photodetection control section 23 controls the operations of the pixel array 21 and the processing section 22.

(Detailed Operation)

In the unit U of the pixel array 21, the photodiode 31 generates an amount of electric charge corresponding to an amount of light received. The LOG amplifier 32 converts a current corresponding to the amount of light received by the photodiode 31 into a voltage. The buffer 33 outputs a signal S33 corresponding to a voltage signal supplied from the LOG amplifier 32. The change detection circuit 34 detects a change amount of the signal S33 supplied from the buffer 33. The selector circuit 35 sequentially couples one of the four change detection circuits 34 in the unit U to the bias circuit 36 and the comparison circuit 37. The bias circuit 36 operates as a bias circuit of the four change detection circuits 34. The four change detection circuits 34 sequentially operate by being sequentially coupled to the bias circuit 36 through the selector circuit 35, and sequentially output a signal corresponding to a change amount of the input signal S33. Therefore, the input terminal of the comparison circuit 37 has a signal S35 including signals corresponding to respective change amounts of four signals S33 inputted to the four change detection circuits 34. The comparison circuit 37 performs a comparison operation on the basis of this signal S35, thereby generating event signals Sevp and Sevn. The transfer circuit 38 outputs the event signals Sevp and Sevn as an event signal Sev on the basis of a control signal Sctl from the photodetection control section 23.

The operations of the change detection circuits 34, the selector circuit 35, and the bias circuit 36 are described in detail below.

FIG. 8 illustrates an operation example of the change detection circuits 34, the selector circuit 35, and the bias circuit 36 in a case where the comparison circuit 37 has detected an event; (A) to (D) illustrate respective waveforms of control signals Srst1 to Srst4, (E) illustrates a waveform of an output signal (a control signal Srst11) of the AND circuit AND1 of the change detection circuit 34 supplied with the control signal Srst1, (F) illustrates a waveform of a control signal Ssel1, (G) illustrates a waveform of an output signal (a control signal Srst12) of the AND circuit AND1 of the change detection circuit 34 supplied with the control signal Srst2, (H) illustrates a waveform of a control signal Ssel2, (I) illustrates a waveform of an output signal (a control signal Srst13) of the AND circuit AND1 of the change detection circuit 34 supplied with the control signal Srst3, (J) illustrates a waveform of a control signal Ssel3, (K) illustrates a waveform of an output signal (a control signal Srst14) of the AND circuit AND1 of the change detection circuit 34 supplied with the control signal Srst4, (L) illustrates a waveform of a control signal Ssel4, and (M) illustrates a waveform of a bias voltage Vbias.

At a timing t11, the photodetection control section 23 changes the bias voltage Vbias from 0 V to a voltage V1 ((M) of FIG. 8). This causes the transistor MN21 of the bias circuit 36 to let a bias current corresponding to this voltage V1 flow, which brings the bias circuit 36 into an active state.

Furthermore, at this timing t11, the photodetection control section 23 changes the control signal Srst1 from low level to high level ((A) of FIG. 8). In the change detection circuit 34 supplied with the control signal Srst1, the AND circuit AND1 generates the control signal Srst11 on the basis of the control signal Srst1 and a control signal Sdet ((E) of FIG. 8). In this example, the comparison circuit 37 has detected an event; thus, the comparison circuit 37 sets the control signal Sdet to high level. Therefore, at this timing t11, the AND circuit AND1 changes the control signal Srst11 from low level to high level in accordance with the change of the control signal Srst1 ((E) of FIG. 8). Thus, in this change detection circuit 34, the transistor MN11 comes into an ON state.

Moreover, at this timing t11, the photodetection control section 23 changes the control signal Ssel1 from low level to high level ((F) of FIG. 8). Thus, the switch SW1 of the selector circuit 35 comes into an ON state.

FIG. 9A illustrates respective operating states of the change detection circuit 34 supplied with the control signal Srst1, the selector circuit 35, and the bias circuit 36 in a period from the timing t11 to a timing t12. In this FIG. 9A, the transistor MN11 and the switches SW1 to SW4 are each depicted in the form of a switch indicating its ON/OFF state.

In the period from the timing t11 to the timing t12, the transistor MN11 comes into an ON state. Thus, the gate and the drain of the transistor MP12 are coupled to each other through the transistor MN11. Furthermore, the switch SW1 coupled to this change detection circuit 34 comes into an ON state, and the switches SW2 and SW3 come into an OFF state. Thus, the change detection circuit 34 is coupled to the bias circuit 36 through the switch SW1, and a bias current Ibias flows into the transistor MP12, the switch SW1, and the transistor MN21 in this order. Thus, voltages of the gate and the drain of the transistor MP12 are determined. This change detection circuit 34 is reset in this way.

Then, at the timing t12, the photodetection control section 23 changes the control signal Srst1 from high level to low level ((A) of FIG. 8). In the change detection circuit 34 supplied with the control signal Srst1, the AND circuit AND1 changes the control signal Srst11 from high level to low level in accordance with the change of the control signal Srst1 ((E) of FIG. 8). Thus, in this change detection circuit 34, the transistor MN11 comes into an OFF state.

Furthermore, at this timing t12, the photodetection control section 23 changes the control signal Ssel1 from high level to low level ((F) of FIG. 8). Thus, the switch SW1 of the selector circuit 35 comes into an OFF state.

Moreover, at this timing t12, the photodetection control section 23 changes the control signal Srst2 from low level to high level ((B) of FIG. 8). In the change detection circuit 34 supplied with the control signal Srst2, the AND circuit AND1 changes the control signal Srst12 from low level to high level in accordance with the change of the control signal Srst2 ((G) of FIG. 8). Thus, in this change detection circuit 34, the transistor MN11 comes into an ON state. Furthermore, at the timing t12, the photodetection control section 23 changes the control signal Ssel2 from low level to high level ((H) of FIG. 8). Thus, the switch SW2 of the selector circuit 35 comes into an ON state. As a result, this change detection circuit 34 is reset.

Then, at a timing t13, the photodetection control section 23 changes the control signal Srst2 from high level to low level ((B) of FIG. 8). In the change detection circuit 34 supplied with the control signal Srst2, the AND circuit AND1 changes the control signal Srst12 from high level to low level in accordance with the change of the control signal Srst2 ((G) of FIG. 8). Thus, in this change detection circuit 34, the transistor MN11 comes into an OFF state. Furthermore, at the timing t13, the photodetection control section 23 changes the control signal Ssel2 from high level to low level ((H) of FIG. 8). Thus, the switch SW2 of the selector circuit 35 comes into an OFF state.

Moreover, at this timing t13, the photodetection control section 23 changes the control signal Srst3 from low level to high level ((C) of FIG. 8). In the change detection circuit 34 supplied with the control signal Srst3, the AND circuit AND1 changes the control signal Srst13 from low level to high level in accordance with the change of the control signal Srst3 ((I) of FIG. 8). Thus, in this change detection circuit 34, the transistor MN11 comes into an ON state. Furthermore, at the timing t13, the photodetection control section 23 changes the control signal Ssel3 from low level to high level ((J) of FIG. 8). Thus, the switch SW3 of the selector circuit 35 comes into an ON state. As a result, this change detection circuit 34 is reset.

Then, at a timing t14, the photodetection control section 23 changes the control signal Srst3 from high level to low level ((C) of FIG. 8). In the change detection circuit 34 supplied with the control signal Srst3, the AND circuit AND1 changes the control signal Srst13 from high level to low level in accordance with the change of the control signal Srst3 ((I) of FIG. 8). Thus, in this change detection circuit 34, the transistor MN11 comes into an OFF state. Furthermore, at the timing t14, the photodetection control section 23 changes the control signal Ssel3 from high level to low level ((J) of FIG. 8). Thus, the switch SW3 of the selector circuit 35 comes into an OFF state.

Moreover, at this timing t14, the photodetection control section 23 changes the control signal Srst4 from low level to high level ((D) of FIG. 8). In the change detection circuit 34 supplied with the control signal Srst4, the AND circuit AND1 changes the control signal Srst14 from low level to high level in accordance with the change of the control signal Srst4 ((K) of FIG. 8). Thus, in this change detection circuit 34, the transistor MN11 comes into an ON state. Furthermore, at the timing t14, the photodetection control section 23 changes the control signal Ssel4 from low level to high level ((L) of FIG. 8). Thus, the switch SW4 of the selector circuit 35 comes into an ON state. As a result, this change detection circuit 34 is reset.

Then, at a timing t15, the photodetection control section 23 changes the control signal Srst4 from high level to low level ((D) of FIG. 8). In the change detection circuit 34 supplied with the control signal Srst4, the AND circuit AND1 changes the control signal Srst14 from high level to low level in accordance with the change of the control signal Srst4 ((K) of FIG. 8). Thus, in this change detection circuit 34, the transistor MN11 comes into an OFF state. Furthermore, at the timing t15, the photodetection control section 23 changes the control signal Ssel4 from high level to low level ((L) of FIG. 8). Thus, the switch SW4 of the selector circuit 35 comes into an OFF state.

Then, at the timing t15, the photodetection control section 23 changes the bias voltage Vbias from the voltage V1 to 0 V ((M) of FIG. 8). This causes the transistor MN21 of the bias circuit 36 to stop the generation of bias current, which brings the bias circuit 36 into an inactive state.

The signal S33 inputted to the change detection circuit 34 supplied with the control signal Srst1 may be changed after the change detection circuit 34 is reset at timings t11 and t12. Likewise, the signal S33 inputted to the change detection circuit 34 supplied with the control signal Srst2 may be changed after the change detection circuit 34 is reset at timings t12 and t13. The signal S33 inputted to the change detection circuit 34 supplied with the control signal Srst3 may be changed after the change detection circuit 34 is reset at timings t13 and t14. The signal S33 inputted to the change detection circuit 34 supplied with the control signal Srst4 may be changed after the change detection circuit 34 is reset at timings t14 and t15.

At a timing t21, the photodetection control section 23 changes the bias voltage Vbias from 0 V to the voltage V1 ((M) of FIG. 8). This causes the transistor MN21 of the bias circuit 36 to let a bias current corresponding to this voltage V1 flow, which brings the bias circuit 36 into an active state.

At the timing t21, the photodetection control section 23 changes the control signal Ssel1 from low level to high level ((F) of FIG. 8). Thus, the switch SW1 of the selector circuit 35 comes into an ON state.

FIG. 9B illustrates respective operating states of the change detection circuit 34 supplied with the control signal Srst1, the selector circuit 35, and the bias circuit 36 in a period from the timing t21 to a timing t22.

In the period from the timing t21 to the timing t22, the switch SW1 coupled to this change detection circuit 34 comes into an ON state, and the switches SW2 and SW3 come into an OFF state. The transistor MN11 is maintained in an OFF state. The bias current Ibias flows into the transistor MP12, the switch SW1, and the transistor MN21 in this order. Thus, the transistor MP12 operates as a source-grounded amp. For example, in a case where the voltage of the signal S33 has decreased after the timing t12, the voltage of the signal S35 becomes higher by a voltage corresponding to an amount of that decrease as compared with the voltage at the time of reset. The gain of this voltage is set, for example, in accordance with capacitance values of the capacitors C1 and C2. Furthermore, in a case where the voltage of the signal S33 has increased after the timing t12, the voltage of the signal S35 becomes lower by a voltage corresponding to an amount of that increase as compared with the voltage at the time of reset. Moreover, in a case where the voltage of the signal S33 has not been changed after the timing t12, the voltage of the signal S35 becomes about the same as the voltage at the time of reset. In this way, the change detection circuit 34 coupled to the switch SW1 outputs, as the signal S35, a voltage corresponding to an amount of a change in voltage of the signal S33 after the timing t12.

The comparison circuit 37 performs a comparison operation on the basis of this signal S35, thereby generating event signals Sevp and Sevn and a control signal Sdet.

FIG. 10 illustrates an operation example of the comparison circuit 37. A voltage Vrst is a voltage that the change detection circuit 34 outputs at the time of reset. A threshold voltage Vthp is a voltage lower than the voltage Vrst, and a threshold voltage Vthn is a voltage higher than the voltage Vrst. The comparison circuit 37 sets the event signal Sevp to low level in a case where the voltage of the signal S35 is lower than the threshold voltage Vthp, and sets the event signal Sevp to high level in a case where the voltage of the signal S35 is higher than the threshold voltage Vthp. Furthermore, the comparison circuit 37 sets the event signal Sevn to low level in a case where the voltage of the signal S35 is lower than the threshold voltage Vthn, and sets the event signal Sevn to high level in a case where the voltage of the signal S35 is higher than the threshold voltage Vthn. Moreover, the comparison circuit 37 sets the control signal Sdet to low level in a case where the voltage of the signal S35 is lower than the threshold voltage Vthn and higher than the threshold voltage Vthp, and sets the control signal Sdet to high level in a case where the voltage of the signal S35 is lower than the threshold voltage Vthp or in a case where the voltage of the signal S35 is higher than the threshold voltage Vthn.

Then, at the timing t22, the photodetection control section 23 changes the control signal Ssel1 from high level to low level ((F) of FIG. 8). Thus, the switch SW1 of the selector circuit 35 comes into an OFF state.

At the timing t22, the photodetection control section 23 changes the control signal Ssel2 from low level to high level ((H) of FIG. 8). Thus, the switch SW2 of the selector circuit 35 comes into an ON state. As a result, the change detection circuit 34 coupled to this switch SW2 outputs, as the signal S35, a voltage corresponding to an amount of a change in voltage of the signal S33 after the timing t13. The comparison circuit 37 performs a comparison operation on the basis of this signal S35, thereby generating event signals Sevp and Sevn and a control signal Sdet. Then, at a timing t23, the photodetection control section 23 changes the control signal Ssel2 from high level to low level ((H) of FIG. 8). Thus, the switch SW2 of the selector circuit 35 comes into an OFF state.

At the timing t23, the photodetection control section 23 changes the control signal Ssel3 from low level to high level ((J) of FIG. 8). Thus, the switch SW3 of the selector circuit 35 comes into an ON state. As a result, the change detection circuit 34 coupled to this switch SW3 outputs, as the signal S35, a voltage corresponding to an amount of a change in voltage of the signal S33 after the timing t14. The comparison circuit 37 performs a comparison operation on the basis of this signal S35, thereby generating event signals Sevp and Sevn and a control signal Sdet. Then, at a timing t24, the photodetection control section 23 changes the control signal Ssel3 from high level to low level ((J) of FIG. 8). Thus, the switch SW3 of the selector circuit 35 comes into an OFF state.

At the timing t24, the photodetection control section 23 changes the control signal Ssel4 from low level to high level ((L) of FIG. 8). Thus, the switch SW4 of the selector circuit 35 comes into an ON state. As a result, the change detection circuit 34 coupled to this switch SW4 outputs, as the signal S35, a voltage corresponding to an amount of a change in voltage of the signal S33 after the timing t15. The comparison circuit 37 performs a comparison operation on the basis of this signal S35, thereby generating event signals Sevp and Sevn and a control signal Sdet. Then, at a timing t25, the photodetection control section 23 changes the control signal Ssel4 from high level to low level ((L) of FIG. 8). Thus, the switch SW4 of the selector circuit 35 comes into an OFF state.

Then, at the timing t25, the photodetection control section 23 changes the bias voltage Vbias from the voltage V1 to 0 V ((M) of FIG. 8). This causes the transistor MN21 of the bias circuit 36 to stop the generation of bias current, which brings the bias circuit 36 into an inactive state.

In this way, in the photodetector 1, the bias circuit 36 is provided posterior to the selector circuit 35, and the selector circuit 35 couples one of the four change detection circuits 34 to the bias circuit 36; therefore, it is possible to reduce the size of the pixels P as described below by comparison with a comparative example.

(Comparative Example)

Subsequently, a photodetector according to a comparative example is described. A unit U in this photodetector includes four pixels P, an AND circuit AND2, the selector circuit 35, the comparison circuit 37, and the transfer circuit 38. In this photodetector, a change detection circuit 34R in each of the four pixels P includes a bias circuit.

Figure 11:
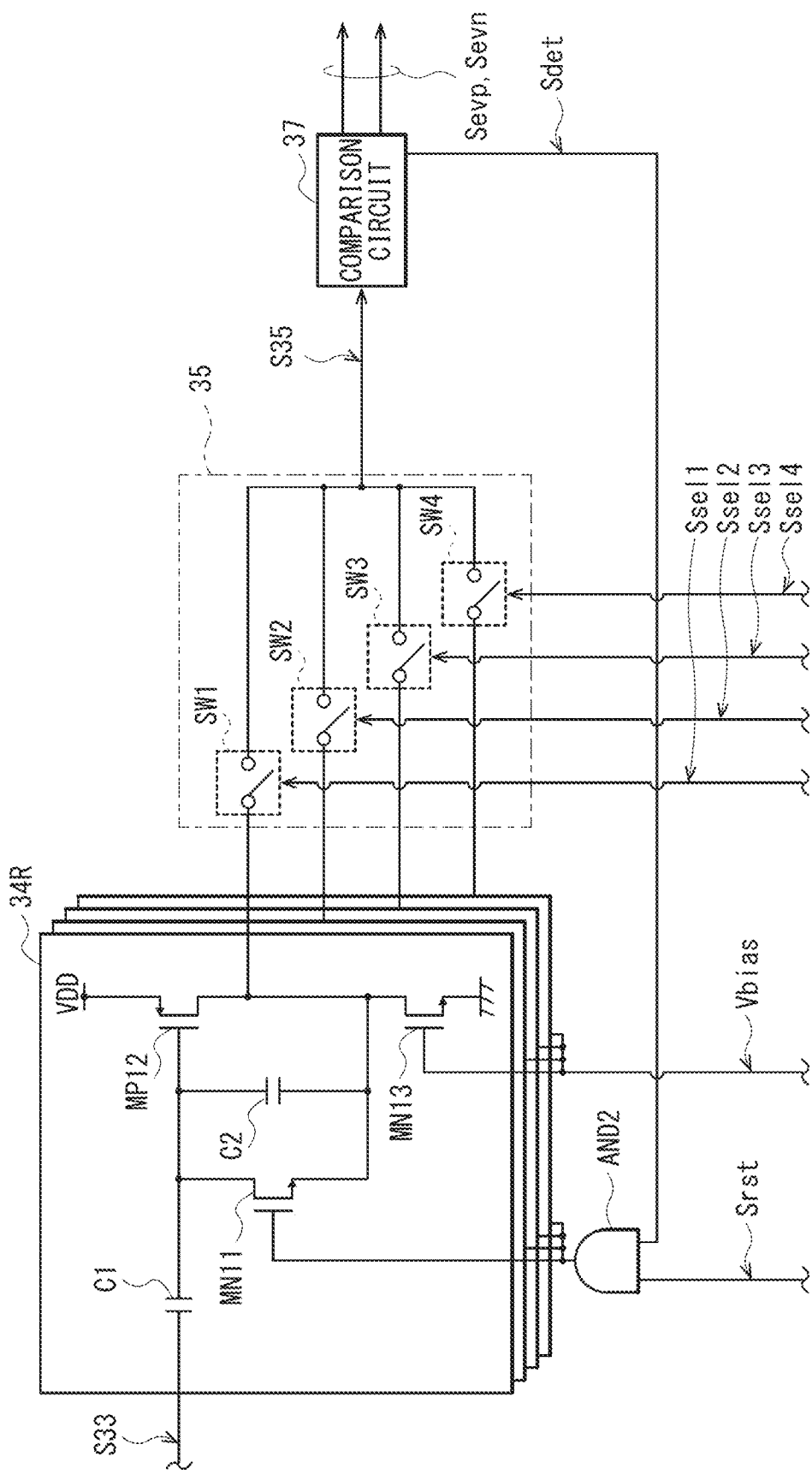
FIG. 11 is a circuit diagram illustrating a configuration example of change detection circuits according to a comparative example.

FIG. 11 illustrates a configuration example of the change detection circuits 34R and the AND circuit AND2. In this FIG. 11, the selector circuit 35 and the comparison circuit 37 are also illustrated.

The change detection circuit 34R includes the capacitor C1, the transistors MN11 and MP12, the capacitor C2, and a transistor MN13. This change detection circuit 34R is one that the AND circuit AND1 is omitted from the change detection circuit 34 according to the present embodiment (FIG. 6) and the transistor MN13 is added to the change detection circuit 34. The gate of the transistor MN11 is coupled to an output terminal of the AND circuit AND2. The transistor MN13 is an N-type MOS transistor, and a gate of the transistor MN13 is supplied with a bias voltage Vbias from the change detection circuit 34R according to the comparative example, a drain is coupled to the source of the transistor MN11, the drain of the transistor MP12, and the other end of the capacitor C2, and a source is grounded. The transistor MN13 corresponds to the transistor MN21 of the bias circuit 36 in the present embodiment.

The AND circuit AND2 is a 2-input AND circuit, and a first input terminal is supplied with a control signal Srst from a photodetection control section 23R according to the comparative example, a second input terminal is supplied with a control signal Sdet from the comparison circuit 37, and an output terminal is coupled to the gates of the respective transistors MN11 of the four change detection circuits 34R.

Figure 12:
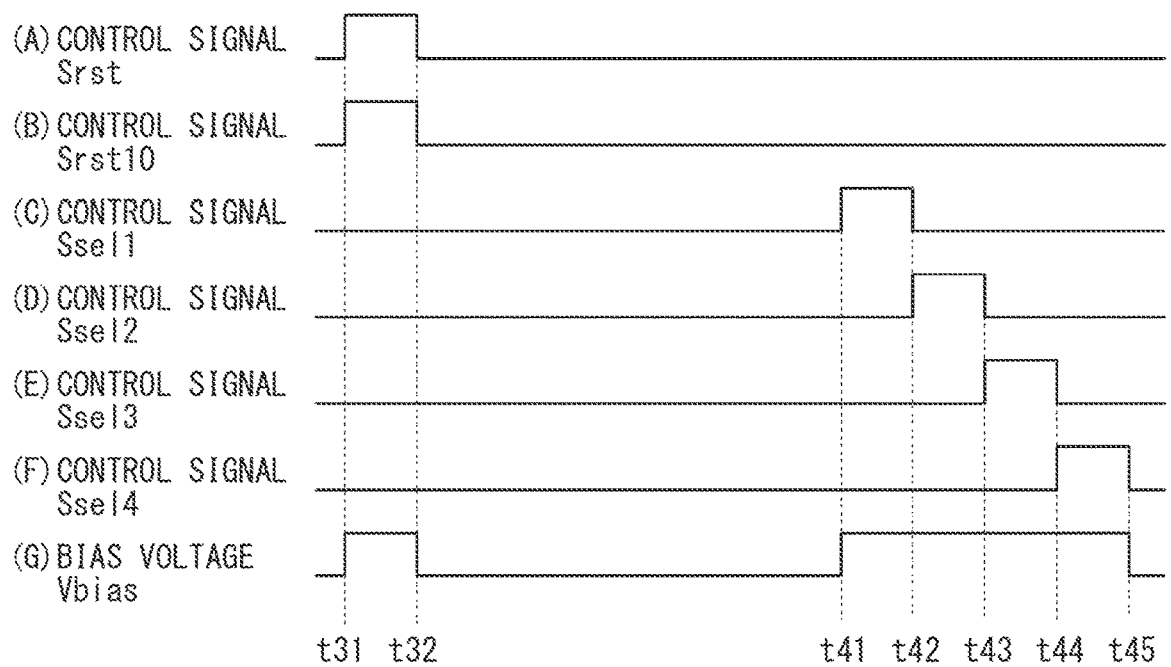
FIG. 12 is a waveform timing diagram illustrating an operation example of the change detection circuits and a selector circuit according to the comparative example.

FIG. 12 illustrates an operation example of the change detection circuits 34R and the selector circuit 35 in a case where the comparison circuit 37 has detected an event; (A) illustrates a waveform of the control signal Srst, (B) illustrates a waveform of an output signal (a control signal Srst10) of the AND circuit AND2, (C) to (F) illustrate respective waveforms of control signals Ssel1 to Ssel4, and (G) illustrates a waveform of the bias voltage Vbias.

At a timing t31, the photodetection control section 23R changes the bias voltage Vbias from 0 V to the voltage V1 ((G) of FIG. 12). This causes the respective transistors MN13 of the four change detection circuits 34R to let a bias current corresponding to this voltage V1 flow.

At this timing t31, the photodetection control section 23R changes the control signal Srst from low level to high level ((A) of FIG. 12). At the timing t31, the AND circuit AND2 changes the control signal Srst10 from low level to high level in accordance with the change of the control signal Srst ((B) of FIG. 12). Thus, in each of these four change detection circuits 34R, the transistor MN11 comes into an ON state, and the gate and the source of the transistor MP12 are coupled to each other. A bias current Ibias flows into the transistor MP12 and the transistor MN13 in this order. Thus, voltages of the gate and the drain of the transistor MP12 are determined. The four change detection circuits 34R are reset in this way.

Then, at a timing t32, the photodetection control section 23R changes the control signal Srst from high level to low level ((A) of FIG. 12). The AND circuit AND2 changes the control signal Srst10 from high level to low level in accordance with the change of the control signal Srst ((B) of FIG. 12). Thus, in each of the four change detection circuits 34R, the transistor MN11 comes into an OFF state.

Then, at this timing t32, the photodetection control section 23R changes the bias voltage Vbias from the voltage V1 to 0 V ((G) of FIG. 12). This causes the respective transistors MN13 of the four change detection circuits 34R to stop the generation of bias current.

At a timing t41, the photodetection control section 23R changes the bias voltage Vbias from 0 V to the voltage V1 ((G) of FIG. 12). This causes the respective transistors MN13 of the four change detection circuits 34R to let a bias current corresponding to this voltage V1 flow.

Furthermore, at this timing t41, the photodetection control section 23R changes the control signal Ssel1 from low level to high level ((C) of FIG. 12). Thus, the switch SW1 of the selector circuit 35 comes into an ON state. As a result, the change detection circuit 34R coupled to this switch SW1 outputs, as the signal S35, a voltage corresponding to an amount of a change in voltage of the signal S33 after the timing t32. The comparison circuit 37 performs a comparison operation on the basis of this signal S35, thereby generating event signals Sevp and Sevn and a control signal Sdet. Then, at a timing t42, the photodetection control section 23R changes the control signal Ssel1 from high level to low level ((C) of FIG. 12). Thus, the switch SW1 of the selector circuit 35 comes into an OFF state.

At the timing t42, the photodetection control section 23R changes the control signal Ssel2 from low level to high level ((D) of FIG. 12). Thus, the switch SW2 of the selector circuit 35 comes into an ON state. As a result, the change detection circuit 34R coupled to this switch SW2 outputs, as the signal S35, a voltage corresponding to an amount of a change in voltage of the signal S33 after the timing t32. The comparison circuit 37 performs a comparison operation on the basis of this signal S35, thereby generating event signals Sevp and Sevn and a control signal Sdet. Then, at a timing t43, the photodetection control section 23R changes the control signal Ssel2 from high level to low level ((D) of FIG. 12). Thus, the switch SW2 of the selector circuit 35 comes into an OFF state.

At the timing t43, the photodetection control section 23R changes the control signal Ssel3 from low level to high level (FIG. 12€). Thus, the switch SW3 of the selector circuit 35 comes into an ON state. As a result, the change detection circuit 34R coupled to this switch SW3 outputs, as the signal S35, a voltage corresponding to an amount of a change in voltage of the signal S33 after the timing t32. The comparison circuit 37 performs a comparison operation on the basis of this signal S35, thereby generating event signals Sevp and Sevn and a control signal Sdet. Then, at a timing t44, the photodetection control section 23R changes the control signal Ssel3 from high level to low level ((E) of FIG. 12). Thus, the switch SW3 of the selector circuit 35 comes into an OFF state.

At the timing t44, the photodetection control section 23R changes the control signal Ssel4 from low level to high level ((F) of FIG. 12). Thus, the switch SW4 of the selector circuit 35 comes into an ON state. As a result, the change detection circuit 34R coupled to this switch SW4 outputs, as the signal S35, a voltage corresponding to an amount of a change in voltage of the signal S33 after the timing t32. The comparison circuit 37 performs a comparison operation on the basis of this signal S35, thereby generating event signals Sevp and Sevn and a control signal Sdet. Then, at a timing t45, the photodetection control section 23R changes the control signal Ssel4 from high level to low level ((F) of FIG. 12). Thus, the switch SW4 of the selector circuit 35 comes into an OFF state.

Then, at the timing t45, the photodetection control section 23R changes the bias voltage Vbias from the voltage V1 to 0 V ((G) of FIG. 12). This causes the respective transistors MN13 of the four change detection circuits 34R to stop the generation of bias current.

As illustrated in FIG. 11, in the photodetector according to the comparative example, the change detection circuit 34R in each of the four pixels P includes the transistor MN13 that is a bias circuit. In this case, the size of the pixels P increases. In a case where the size of the pixels P is large as described above, for example, the chip size of a photodetection device increases. Furthermore, in a case where the size of the pixels P is large as described above, it is difficult to increase the number of pixels P, which makes it difficult to enhance the resolution of the photodetector.

Furthermore, as illustrated in FIG. 12, in the photodetector according to the comparative example, in a period from the timing t41 to the timing t45, the respective transistors MN13 of the four change detection circuits 34 let the bias current Ibias flow. Thus, in this photodetector, power consumption increases.

Meanwhile, in the photodetector 1 according to the present embodiment, as illustrated in FIG. 6, the bias circuit 36 is provided posterior to the selector circuit 35, and the selector circuit 35 couples one of the four change detection circuits 34 to the bias circuit 36. Thus, unlike in the case of the comparative example, the transistor MN13 is able to be omitted from the pixel P, and therefore it is possible to reduce the size of the pixels P. As a result, in the photodetector 1, for example, it is possible to reduce the chip size of the photodetection device 12. Furthermore, for example, in a case where the number of pixels P is increased by reducing the size of the pixels P, it is possible to enhance the resolution of the photodetector 1.

Furthermore, in the photodetector 1 according to the present embodiment, as illustrated in FIG. 8, in a period from the timing t21 to the timing t25, one bias circuit 36 lets the bias current Ibias flow. Thus, in the photodetector 1, it is possible to reduce power consumption caused by the bias current Ibias in this period to "one-quarter". Therefore, it is possible to reduce power consumption in the photodetector 1.

In this way, the photodetector 1 includes: a plurality of pixels P each including the photodiode 31, the LOG amplifier 32 and the buffer 33 that generate a light-receiving signal corresponding to an amount of light received by the photodiode 31, and the change detection circuit 34 that detects an amount of a change in the light-receiving signal; the selector circuit 35 that couples one of the plurality of change detection circuits 34 in the plurality of pixels P to a coupling node; the bias circuit 36 coupled to the coupling node; and the comparison circuit 37 that generates event signals Sevp and Sevn by comparing a signal in the coupling node and the threshold voltages Vthp and Vthn with each other. Thus, in the photodetector 1, each of the plurality of change detection circuits 34 includes no bias circuit, which makes it possible to reduce the size of the pixels P. Furthermore, in the photodetector 1, one bias circuit 36 lets the bias current Ibias flow; therefore, it is possible to reduce power consumption.

Moreover, in the photodetector 1, the selector circuit 35 sequentially couples one of the plurality of change detection circuits 34 to the coupling node in a period from the timing t11 to the timing t15 or a period from the timing t21 to the timing t25 as illustrated in FIG. 8. Then, the photodetection control section 23 sets, in each of these periods, the voltage of the gate of the first transistor (the transistor MN21) to an active voltage (the voltage V1) that brings the bias circuit 36 into an active state, and sets, in a period other than these periods, the voltage of the gate of the first transistor (the transistor MN21) to an inactive voltage (0 V) that brings the bias circuit 36 into an inactive state. Thus, in the photodetector 1, it is possible to effectively reduce power consumption.

[Effects]

As described above, in the present embodiment, a photodetector includes: a plurality of pixels each including a photodiode, a LOG amp and a buffer that generate a light-receiving signal corresponding to an amount of light received by the photodiode, and a change detection circuit that detects an amount of a change in the light-receiving signal; a selector circuit that couples one of a plurality of the change detection circuits in the plurality of pixels to a coupling node; a bias circuit coupled to the coupling node; and a comparison circuit that generates an event signal by comparing a signal in the coupling node and a threshold voltage with each other. Thus, it is possible to reduce the size of the pixels. Furthermore, for example, it is possible to reduce power consumption.

In the present embodiment, as illustrated in FIG. 8, the selector circuit sequentially couples one of the plurality of the change detection circuits to the coupling node in a first period. Then, a photodetection control unit sets, in each of these periods, the voltage of a gate of a first transistor to an active voltage that brings the bias circuit into an active state, and sets, in a period other than these periods, the voltage of the gate of the first transistor to an inactive voltage that brings the bias circuit into an inactive state. Thus, it is possible to effectively reduce power consumption.

Modification Example 1

Figure 13:
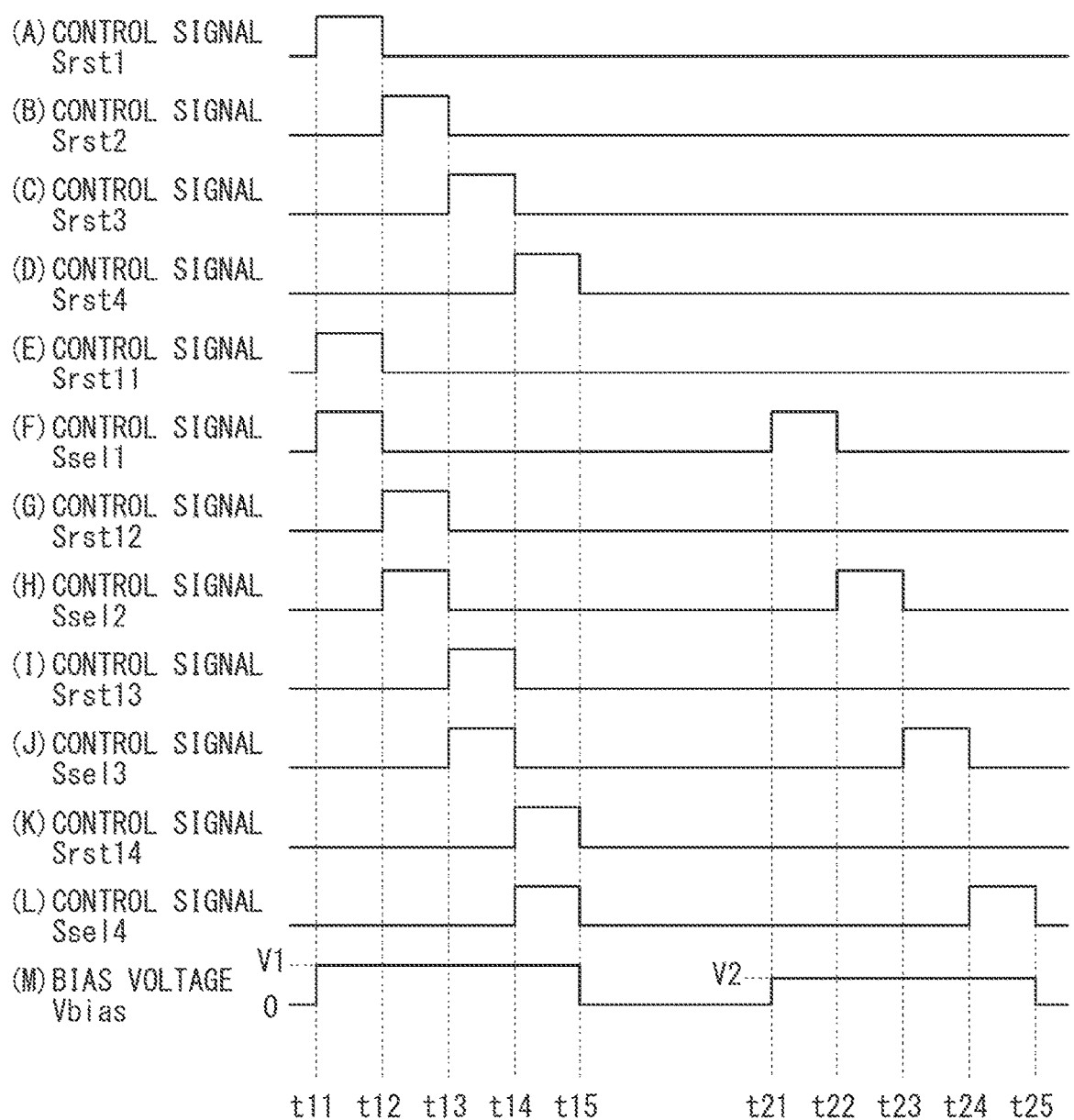
FIG. 13 is a waveform timing diagram illustrating an operation example of change detection circuits, a selector circuit, and a bias circuit according to a modification example.

In the above-described embodiment, as illustrated in FIG. 8, the photodetection control section 23 sets the bias voltage Vbias to the voltage V1 in the period from the timing t11 to the timing t15, and sets the bias voltage Vbias to the voltage V1 in the period from the timing t21 to the timing t25; however, this is not limitative. Alternatively, for example, as illustrated in FIG. 13, the photodetection control section 23 may set the bias voltage Vbias to the voltage V1 in the period from the timing t11 to the timing t15, and set the bias voltage Vbias to a voltage V2 different from the voltage V1 in the period from the timing t21 to the timing t25.

Modification Example 2

Figure 14:
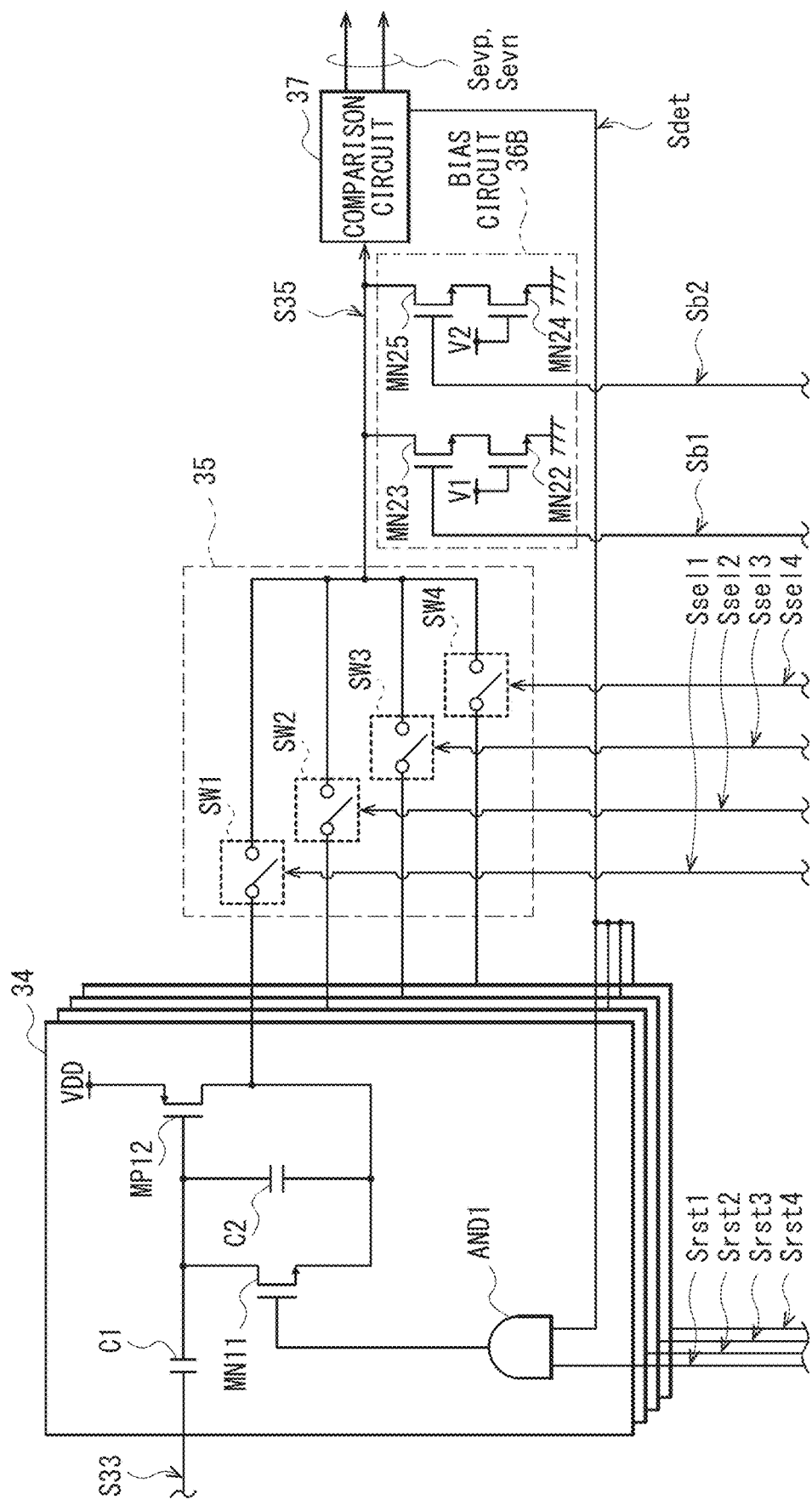
FIG. 14 is a circuit diagram illustrating a configuration example of change detection circuits, a selector circuit, and a bias circuit according to another modification example.

In the above-described embodiment, the bias circuit 36 includes the transistor MN21; however, this is not limitative. For example, in a case where the bias voltage Vbias in the period from the timing t11 to the timing t15 is different from the bias voltage Vbias in the period from the timing t21 to the timing t25 as presented in Modification Example 1, a bias circuit 36B illustrated in FIG. 14 may be provided. This bias circuit 36B includes transistors MN22, MN23, MN24, and MN25. The transistors MN22 to MN25 are N-type MOS transistors. A gate of the transistor MN22 is supplied with the voltage V1, a drain is coupled to a source of the transistor MN23, and a source is grounded. A gate of the transistor MN23 is supplied with a control signal Sb1 from a photodetection control section 23B according to the present modification example, a drain is coupled to a drain of the transistor MN25, the output terminal of the selector circuit 35, and the input terminal of the comparison circuit 37, and the source is coupled to the drain of the transistor MN22. A gate of the transistor MN24 is supplied with the voltage V2, a drain is coupled to a source of the transistor MN25, and a source is grounded. A gate of the transistor MN25 is supplied with a control signal Sb2 from the photodetection control section 23B according to the present modification example, the drain is coupled to the drain of the transistor MN23, the output terminal of the selector circuit 35, and the input terminal of the comparison circuit 37, and the source is coupled to the drain of the transistor MN24.

The transistor MN22 here corresponds to a specific example of the "first transistor" in the present disclosure. The transistor MN23 corresponds to a specific example of a "first switch" in the present disclosure. The transistor MN24 corresponds to a specific example of a "second transistor" in the present disclosure. The transistor MN25 corresponds to a specific example of the "second switch" in the present disclosure. The photodetection control section 23B corresponds to a specific example of the "control circuit" in the present disclosure.

Figure 15:
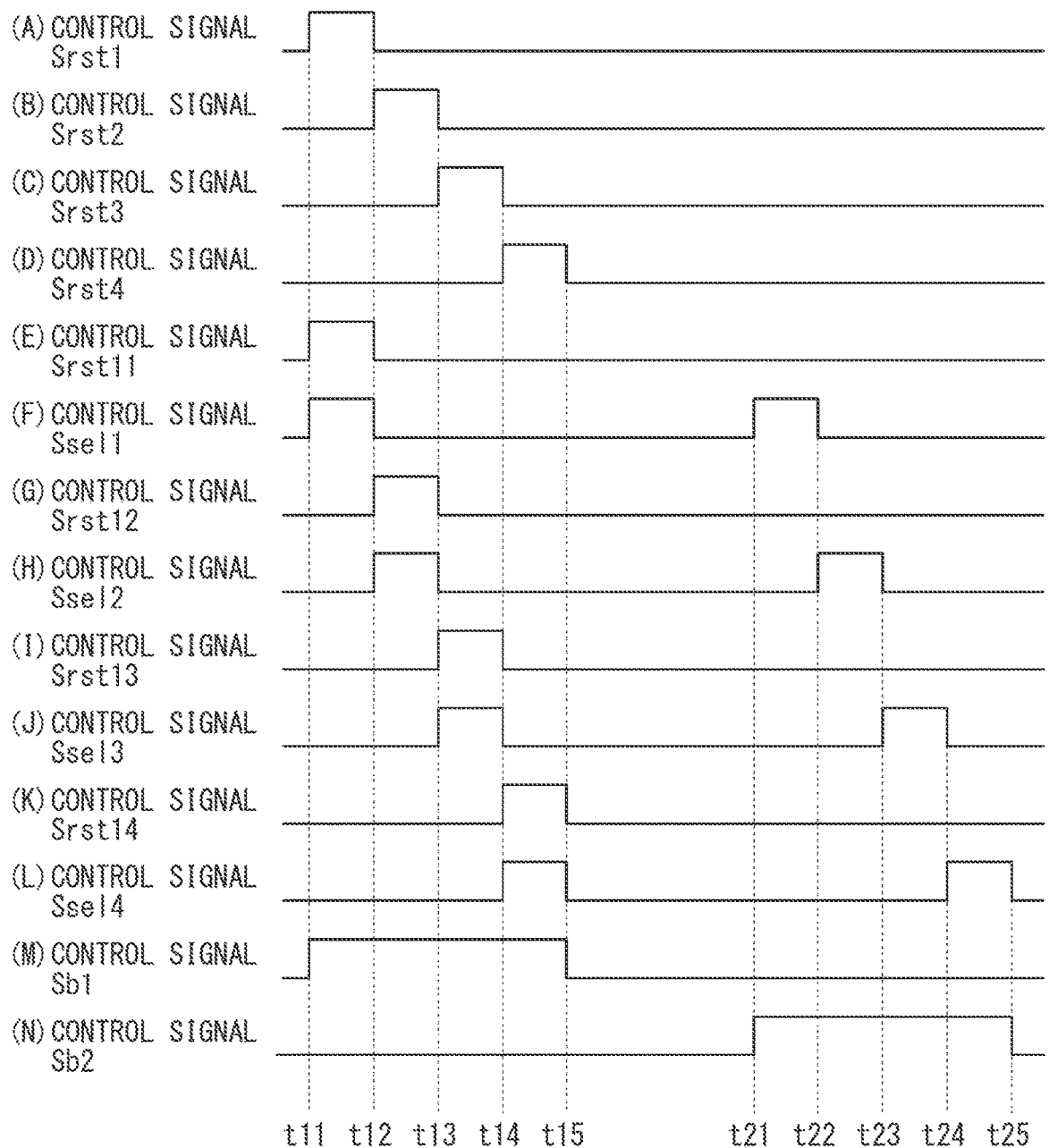
FIG. 15 is a waveform timing diagram illustrating an operation example of the change detection circuits, the selector circuit, and the bias circuit illustrated in FIG. 14.

FIG. 15 illustrates an operation example of the change detection circuits 34, the selector circuit 35, and the bias circuit 36B in a case where the comparison circuit 37 has detected an event; (A) to (D) illustrate respective waveforms of control signals Srst1 to Srst4, (E) illustrates a waveform of an output signal (a control signal Srst11) of the AND circuit AND1 of the change detection circuit 34 supplied with the control signal Srst1, (F) illustrates a waveform of a control signal Ssel1, (G) illustrates a waveform of an output signal (a control signal Srst12) of the AND circuit AND1 of the change detection circuit 34 supplied with the control signal Srst2, (H) illustrates a waveform of a control signal Ssel2, (I) illustrates a waveform of an output signal (a control signal Srst13) of the AND circuit AND1 of the change detection circuit 34 supplied with the control signal Srst3, (J) illustrates a waveform of a control signal Ssel3, (K) illustrates a waveform of an output signal (a control signal Srst14) of the AND circuit AND1 of the change detection circuit 34 supplied with the control signal Srst4, (L) illustrates a waveform of a control signal Ssel4, (M) illustrates a waveform of a control signal Sb1, and (N) illustrates a waveform of a control signal Sb2. This FIG. 15 correspond to FIG. 8 illustrating the operation according to the above-described embodiment.

At the timing t11, the photodetection control section 23B changes the control signal Sb1 from low level to high level ((M) of FIG. 15). Thus, the transistor MN23 comes into an ON state, and the transistors MN22 and MN23 of the bias circuit 36B let a bias current corresponding to the voltage V1 flow, which brings the bias circuit 36B into an active state. Then, at the timing t15, the photodetection control section 23B changes the control signal Sb1 from high level to low level. Thus, the transistor MN23 comes into an OFF state, and the transistors MN22 and MN23 of the bias circuit 36B stop the generation of bias current, which brings the bias circuit 36B into an inactive state.

At the timing t21, the photodetection control section 23B changes the control signal Sb2 from low level to high level ((N) of FIG. 15). Thus, the transistor MN25 comes into an ON state, and the transistors MN24 and MN25 of the bias circuit 36B let a bias current corresponding to the voltage V1 flow, which brings the bias circuit 36B into an active state. Then, at the timing t25, the photodetection control section 23B changes the control signal Sb2 from high level to low level. Thus, the transistor MN25 comes into an OFF state, and the transistors MN24 and MN25 of the bias circuit 36B stop the generation of bias current, which brings the bias circuit 36B into an inactive state.

Modification Example 3

In the above-described embodiment, the change detection circuits 34 and the bias circuit 36 are configured as illustrated in FIG. 6; however, this is not limitative. The present modification example is described below with reference to some examples.

Figure 16:
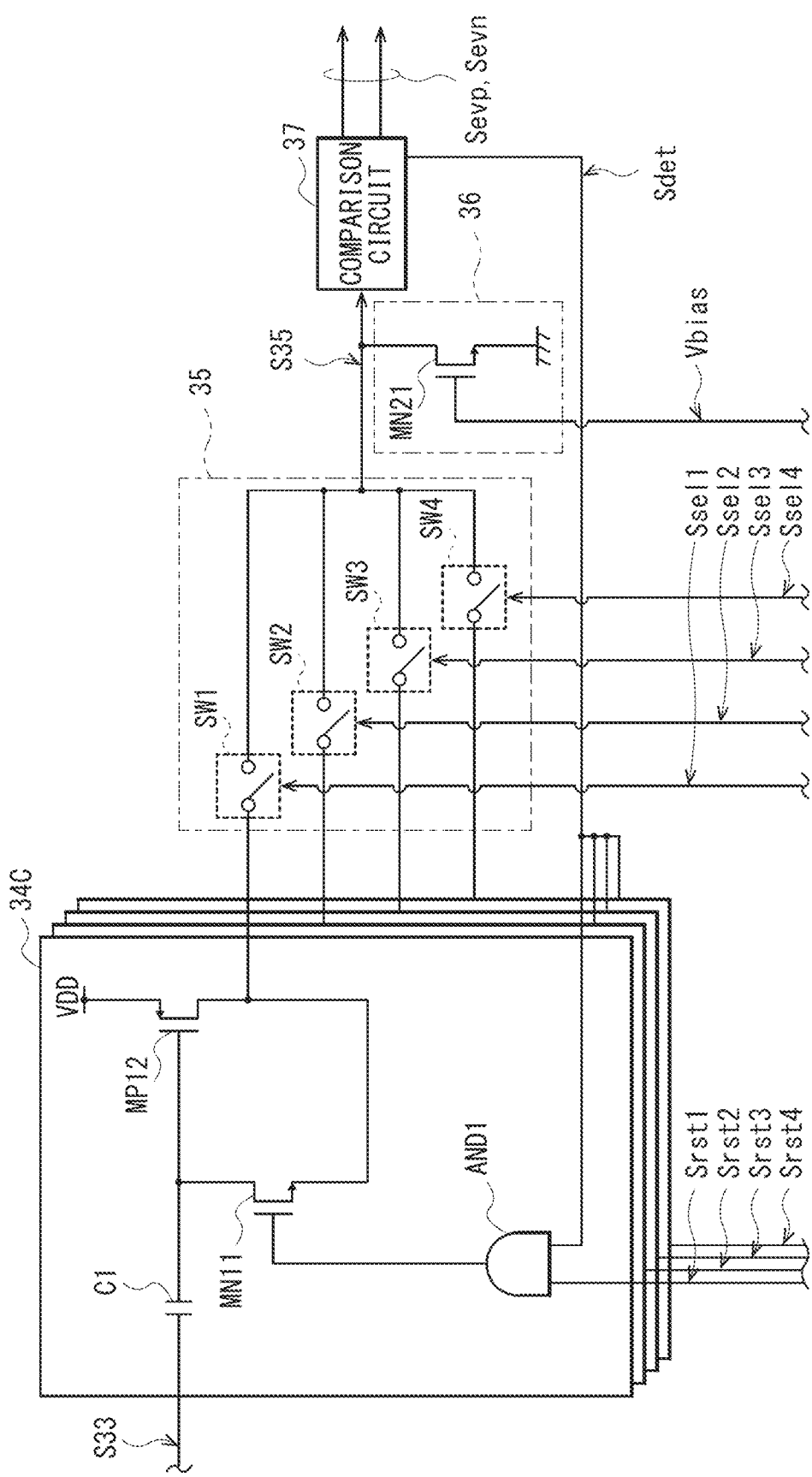
FIG. 16 is a circuit diagram illustrating a configuration example of change detection circuits according to still another modification example.

FIG. 16 illustrates a configuration example of a change detection circuit 34C according to the present modification example. The change detection circuit 34C includes the capacitor C1, the transistors MN11 and MP12, and the AND circuit AND1. That is, the change detection circuit 34C is one that the capacitor C2 is omitted from the change detection circuit 34 according to the above-described embodiment (FIG. 6). In this case, the gain of the change detection circuit 34C depends on a capacitance value of the capacitor C1 and the gate-drain parasitic capacitance of the transistor MP12.

Figure 17:
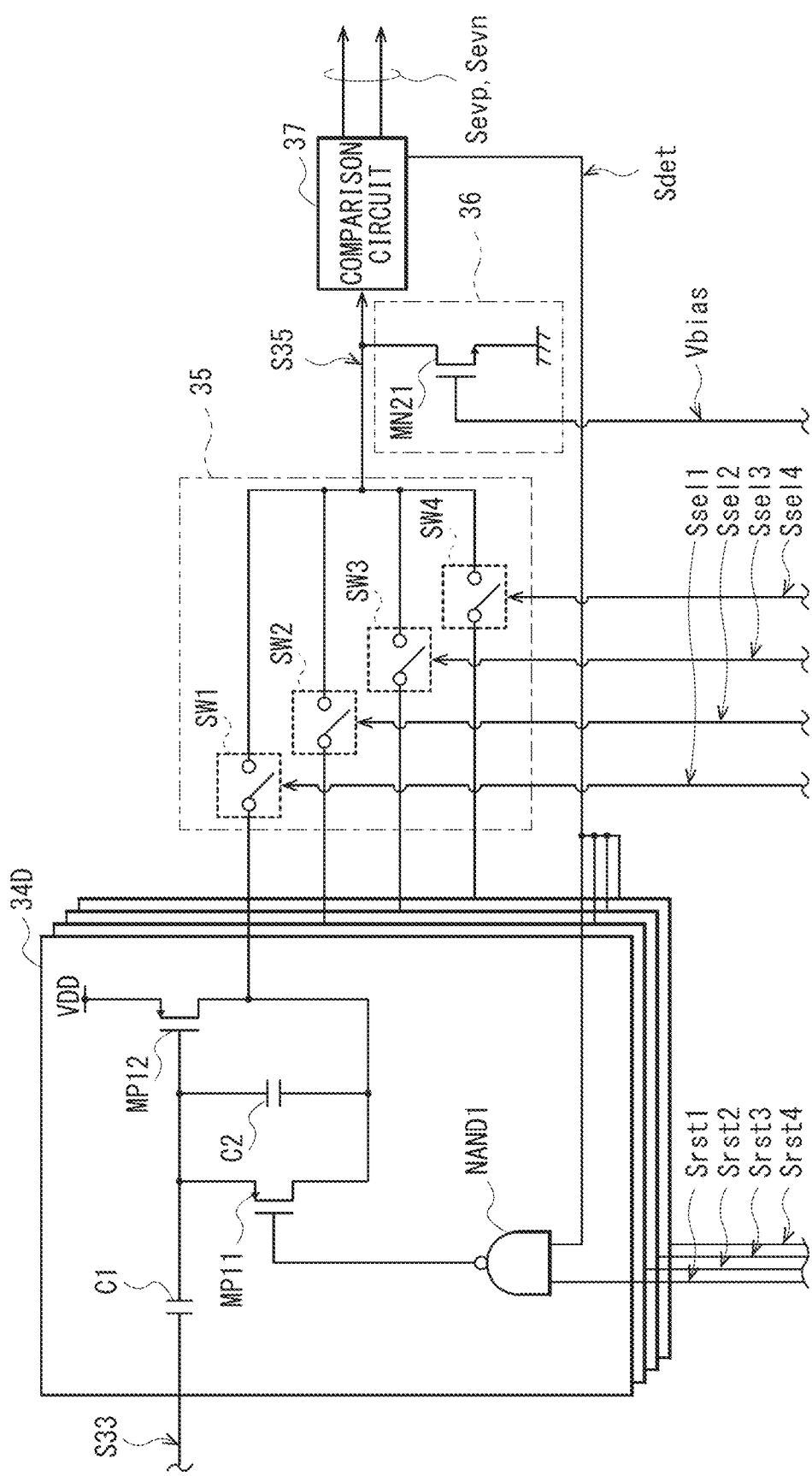
FIG. 17 is a circuit diagram illustrating a configuration example of change detection circuits according to still another modification example.

FIG. 17 illustrates a configuration example of another change detection circuit 34D according to the present modification example. The change detection circuit 34D includes the capacitor C1, transistors MP11 and MP12, the capacitor C2, and an NAND circuit NAND1. That is, the change detection circuit 34D is one that, in the change detection circuit 34 according to the above-described embodiment (FIG. 6), the transistor MN11 and the AND circuit AND1 are replaced with the transistor MP11 and the NAND circuit NAND1. The transistor MP11 is a P-type MOS transistor, and a gate is coupled to an output terminal of the NAND circuit NAND1, a source is coupled to the other end of the capacitor C1, one end of the capacitor C2, and the gate of the transistor MP12, and a drain is coupled to the drain of the transistor MP12, the other end of the capacitor C2, and the selector circuit 35. The NAND circuit NAND1 a 2-input NAND circuit, and a first input terminal is supplied with the control signal Srst from the photodetection control section 23, a second input terminal is supplied with the control signal Sdet from the comparison circuit 37, and the output terminal is coupled to the gate of a transistor MP14.

Figure 18:
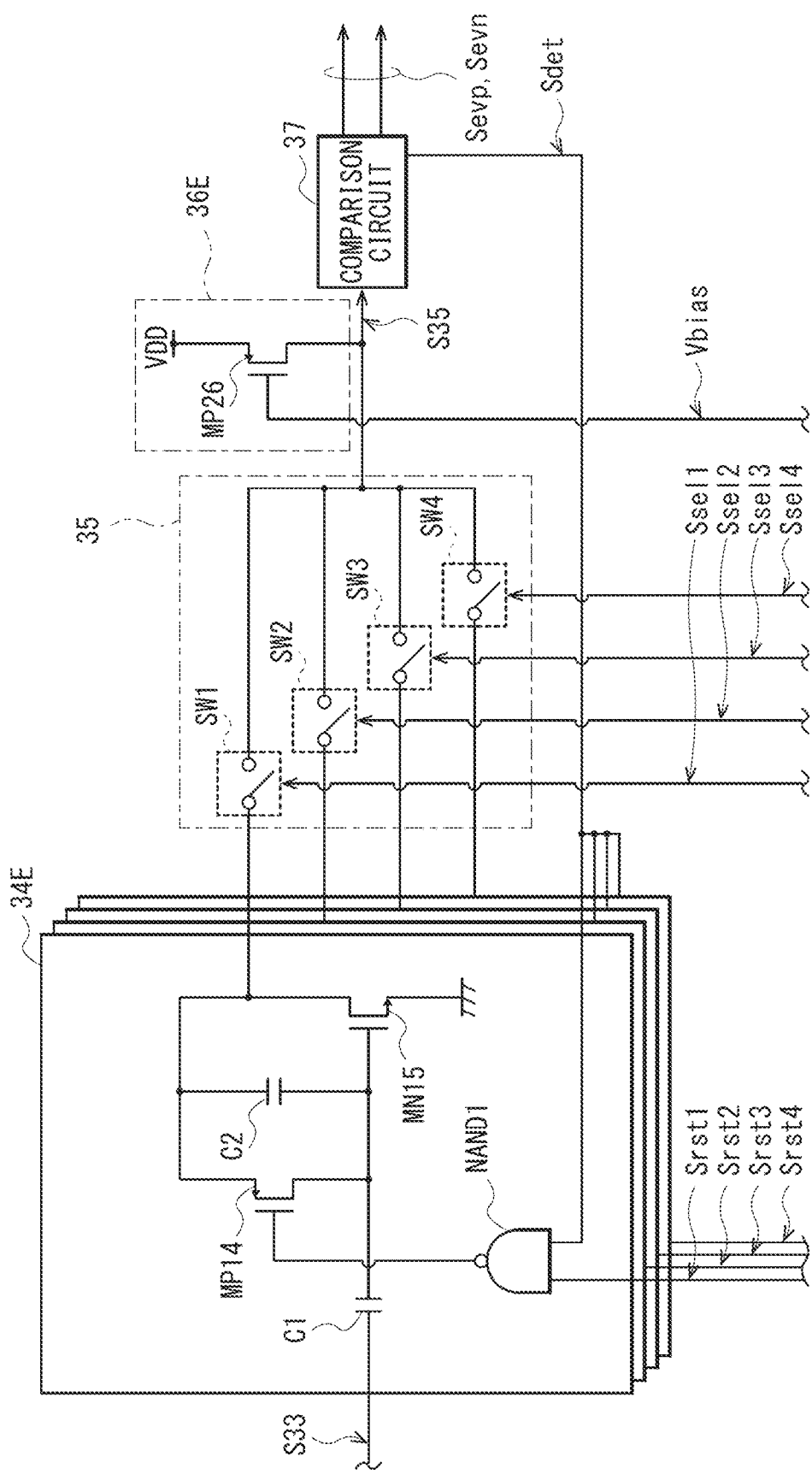
FIG. 18 is a circuit diagram illustrating a configuration example of change detection circuits and a bias circuit according to still another modification example.

FIG. 18 illustrates a configuration example of another change detection circuit 34E and a bias circuit 36E according to the present modification example.

The change detection circuit 34E includes the capacitor C1, transistors MP14 and MN15, the capacitor C2, and the NAND circuit NAND1. The transistor MP14 is a P-type MOS transistor, and the transistor MN15 is an N-type MOS transistor.

One end of the capacitor C1 is supplied with the signal S33 from the buffer 33, and the other end is coupled to a drain of the transistor MP14, a gate of the transistor MN15, and one end of the capacitor C2. A gate of the transistor MP14 is coupled to the output terminal of the NAND circuit NAND1, a source is coupled to a drain of the transistor MN15, the other end of the capacitor C2, and the selector circuit 35, and the drain is coupled to the other end of the capacitor C1, the one end of the capacitor C2, and the gate of the transistor MN15. The gate of the transistor MN15 is coupled to the other end of the capacitor C1, the drain of the transistor MP14, and the one end of the capacitor C2, the drain is coupled to the source of the transistor MP14, the other end of the capacitor C2, and the selector circuit 35, and a source is grounded. The one end of the capacitor C2 is coupled to the other end of the capacitor C1, the drain of the transistor MP14, and the gate of the transistor MN15, and the other end is coupled to the source of the transistor MP14, the drain of the transistor MN15, and the selector circuit 35. The NAND circuit NAND1 is a 2-input NAND circuit, and a first input terminal is supplied with the control signal Srst from the photodetection control section 23, a second input terminal is supplied with the control signal Sdet from the comparison circuit 37, and the output terminal is coupled to the gate of the transistor MP14.

The bias circuit 36E includes a transistor MP26. The transistor MP26 is a P-type MOS transistor, and a gate is supplied with the bias voltage Vbias from the photodetection control section 23, a source is supplied with the power supply voltage VDD, and a drain is coupled to the output terminal of the selector circuit 35 and the input terminal of the comparison circuit 37.

Modification Example 4

In the above-described embodiment, as illustrated in FIG. 6, the change detection circuit 34 is provided with the two transistors MN11 and MP12; however, this is not limitative, and may be provided with three or more transistors. The present modification example is described below with reference to some examples.

Figure 19:
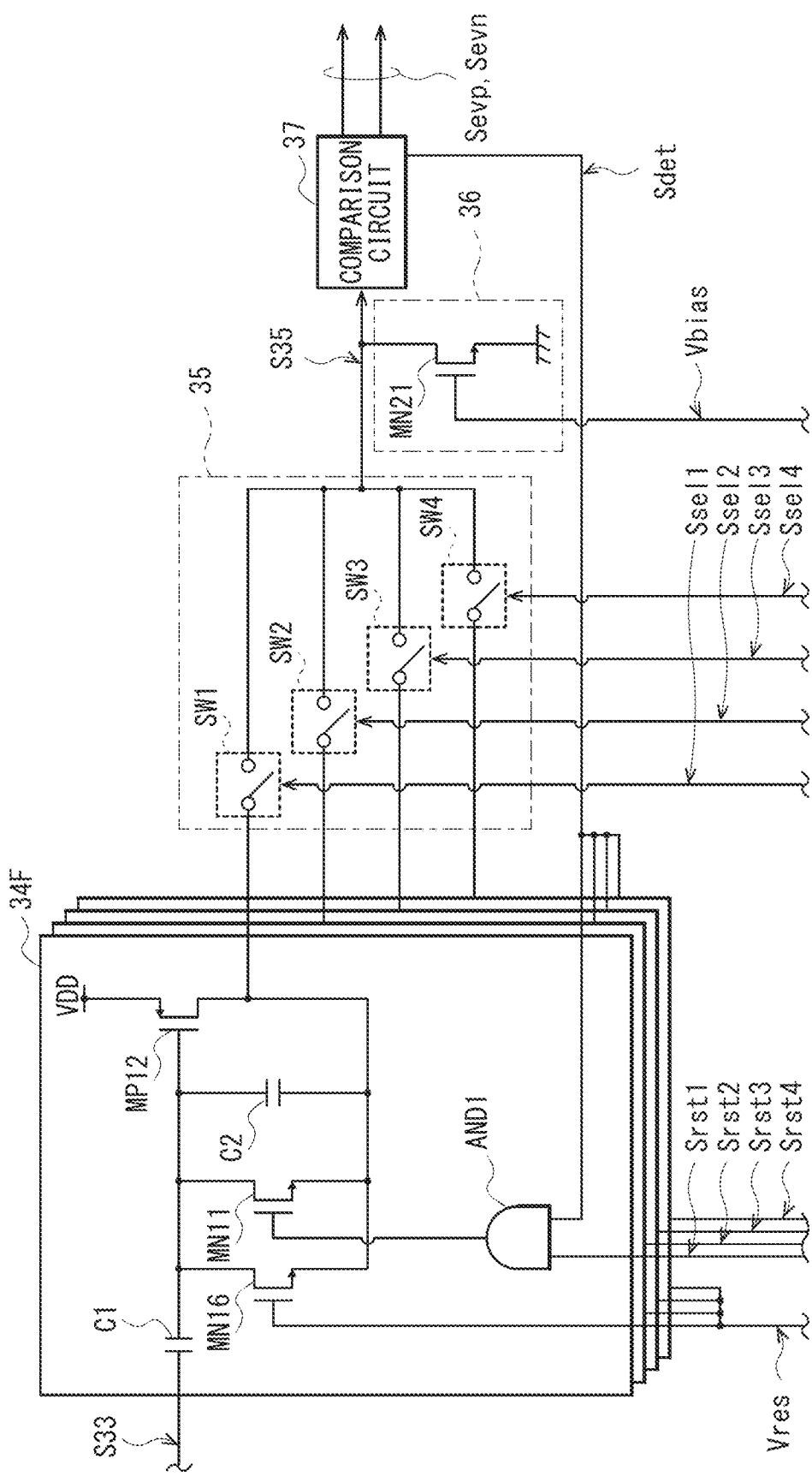
FIG. 19 is a circuit diagram illustrating a configuration example of change detection circuits according to still another modification example.

FIG. 19 illustrates a configuration example of a change detection circuit 34F according to the present modification example. The change detection circuit 34F includes a transistor MN16. The transistor MN16 is an N-type MOS transistor, and a gate is supplied with a voltage Vres from a photodetection control section 23F according to the present modification example, a drain is coupled to the other end of the capacitor C1, the drain of the transistor MN11, the one end of the capacitor C2, and the gate of the transistor MP12, and a source is coupled to the source of the transistor MN11, the other end of the capacitor C2, the drain of the transistor MP12, and the selector circuit 35. This transistor MN16 corresponds to a specific example of a "fifth transistor" in the present disclosure. Thus, the change detection circuit 34F is able to operate as a differentiating circuit in a case where the transistor MN11 is in an OFF state.

Figure 20:
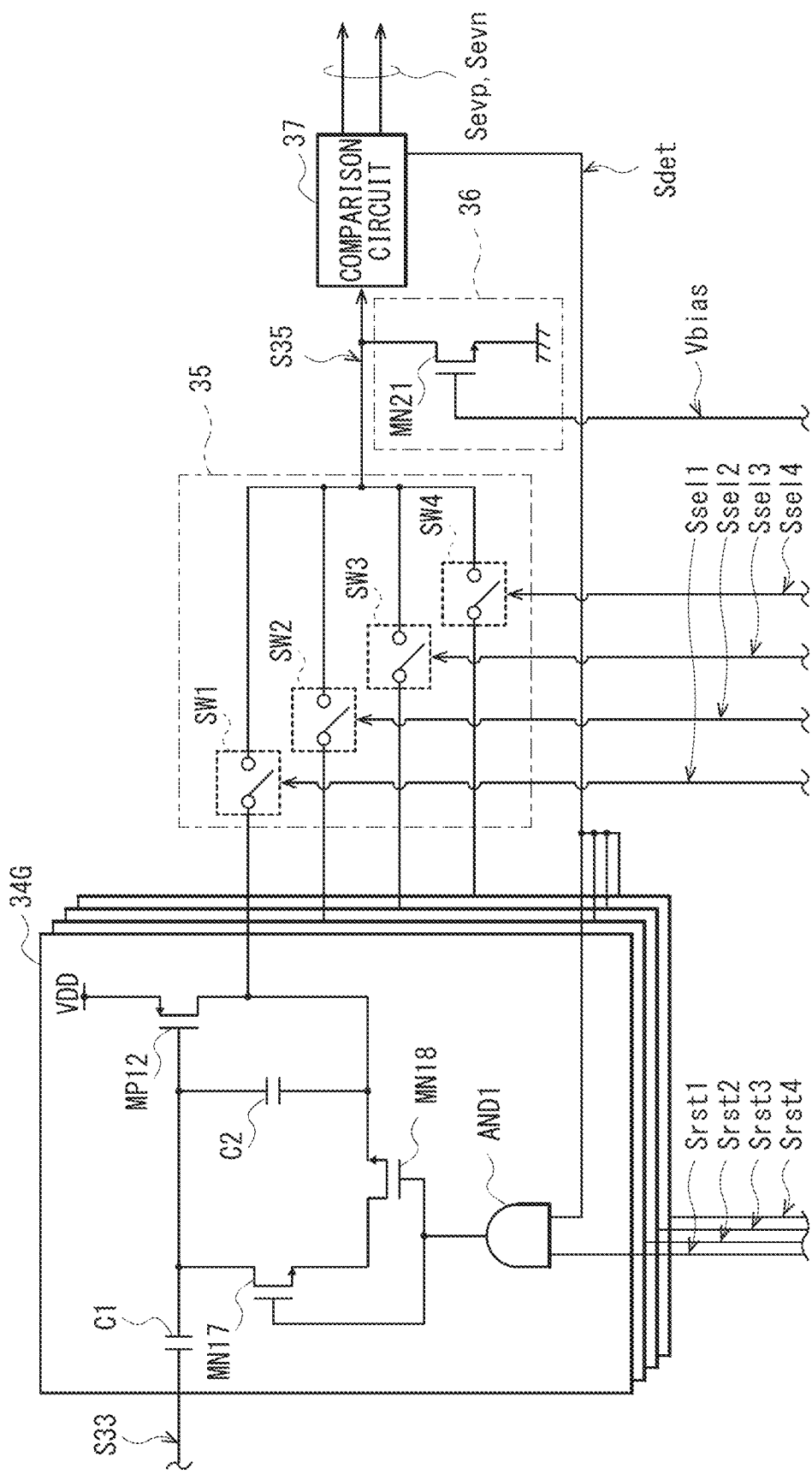
FIG. 20 is a circuit diagram illustrating a configuration example of change detection circuits according to still another modification example.

FIG. 20 illustrates a configuration example of another change detection circuit 34G according to the present modification example. The change detection circuit 34G includes transistors MN17 and MN18. The transistors MN17 and MN18 are N-type MOS transistors. A gate of the transistor MN17 is coupled to the output terminal of the AND circuit AND1, a drain is coupled to the other end of the capacitor C1, the one end of the capacitor C2, and the gate of the transistor MP12, and a source is coupled to a drain of the transistor MN18. A gate of the transistor MN18 is coupled to the output terminal of the AND circuit AND1, the drain is coupled to the source of the transistor MN17, a source is coupled to the drain of the transistor MP12, the other end of the capacitor C2, and the selector circuit 35. The output terminal of the AND circuit AND1 is coupled to the gate of the transistor MN17 and the gate of the transistor MN18. In the change detection circuit 34G, the transistors MN17 and MN18 are coupled in series. The transistor MN17 here corresponds to a specific example of a "sixth transistor" in the present disclosure. The transistor MN18 corresponds to a specific example of a "seventh transistor" in the present disclosure. Thus, in the change detection circuit 34G, when the transistors MN17 and MN18 are brought into an OFF state, a leakage current flowing through these transistors MN17 and MN18 is able to be suppressed.

Figure 21:
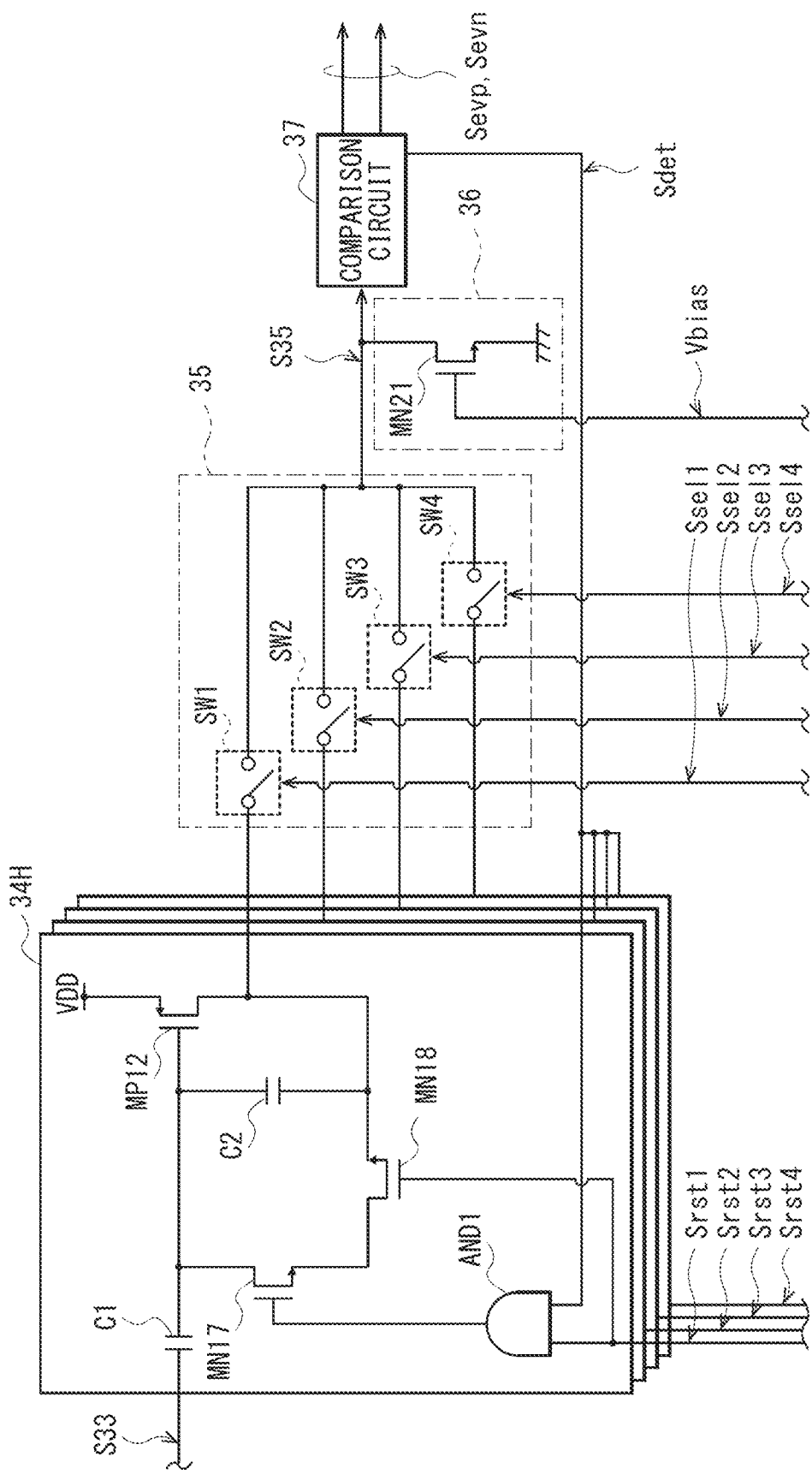
FIG. 21 is a circuit diagram illustrating a configuration example of change detection circuits according to still another modification example.

FIG. 21 illustrates a configuration example of another change detection circuit 34H according to the present modification example. The change detection circuit 34H includes the transistors MN17 and MN18. The transistors MN17 and MN18 are N-type MOS transistors. The gate of the transistor MN17 is coupled to the output terminal of the AND circuit AND1, the drain is coupled to the other end of the capacitor C1, the one end of the capacitor C2, and the gate of the transistor MP12, and the source is coupled to the drain of the transistor MN18. The gate of the transistor MN18 is supplied with the control signal Srst, the drain is coupled to the source of the transistor MN17, and the source is coupled to the drain of the transistor MP12, the other end of the capacitor C2, and the selector circuit 35. The output terminal of the AND circuit AND1 is coupled to the gate of the transistor MN17. In the change detection circuit 34H, the transistors MN17 and MN18 are coupled in series. Thus, in the change detection circuit 34H, when the transistors MN17 and MN18 are brought into an OFF state, a leakage current flowing through these transistors MN17 and MN18 is able to be suppressed. Furthermore, when the transistor MN18 comes into an ON state, the voltage of the source of the transistor MN17 becomes the same voltage as the voltage of the drain of the transistor MP12. Thus, the drain-source voltage of the transistor MN17 is secured, which makes it possible to suppress a leakage current of the transistor MN17.

Other Modification Example

Furthermore, of these modification examples, two or more may be combined.

2. Example of Practical Application to Mobile Body

The technology (the present technology) according to the present disclosure is applicable to a variety of products. For example, the technology according to the present disclosure may be achieved as an apparatus to be installed aboard any type of mobile body such as an automobile, an electric vehicle, a hybrid electric vehicle, a motorcycle, a bicycle, a personal mobility, an airplane, a drone, a vessel, or a robot.

Figure 22:
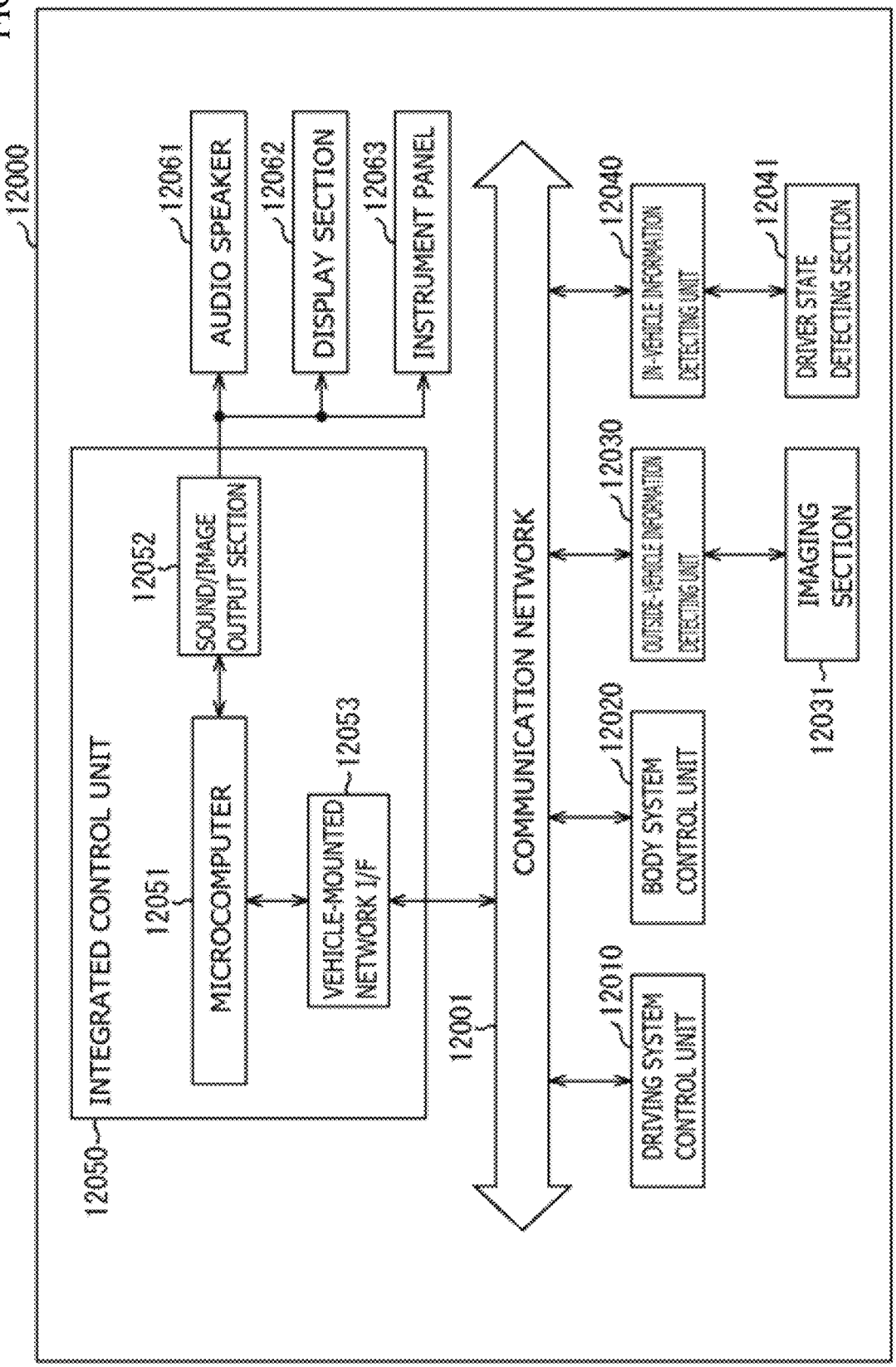
FIG. 22 is a block diagram illustrating an example of a schematic configuration of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 among the above-described components. Thus, in the vehicle control system 12000, detection information INF is generated by the processing section 22 on the basis of an event signal Sev generated by the pixel array 21, and analysis of an object to be detected is made by the analysis unit 13 on the basis of this detection information INF. For example, in a case where the resolution is enhanced by reducing the size of the pixels P, it is possible for the vehicle control system 12000 to achieve, with high accuracy, a collision avoidance or collision mitigation function for the vehicle, a following driving function based on vehicle-to-vehicle distance, a vehicle speed maintaining driving function, a warning function against collision of the vehicle, a warning function against deviation of the vehicle from a lane, and the like.

Although the present technology has been described above with reference to the embodiment, the modification examples, and the specific practical application example thereof, the present technology is not limited to the embodiment and the like, and may be modified in a wide variety of ways.

For example, in the above-described embodiment, the photodiode 31 and the transistors MN1 and MN2 of the LOG amplifier 32 are formed in the semiconductor chip 101, and the transistor MP3 of the LOG amplifier 32, the buffer 33, the change detection circuit 34, the selector circuit 35, and the bias circuit 36 are formed in the semiconductor chip 102; however, this is not limitative. Alternatively, for example, the photodiode 31 may be formed in the semiconductor chip 101, and the LOG amplifier 32, the buffer 33, the change detection circuit 34, the selector circuit 35, and the bias circuit 36 may be formed in the semiconductor chip 102. Furthermore, for example, the photodiode 31 and the LOG amplifier 32 may be formed in the semiconductor chip 101, and the buffer 33, the change detection circuit 34, the selector circuit 35, and the bias circuit 36 may be formed in the semiconductor chip 102. Moreover, for example, the photodiode 31, the LOG amplifier 32, and the buffer 33 may be formed in the semiconductor chip 101, and the change detection circuit 34, the selector circuit 35, and the bias circuit 36 may be formed in the semiconductor chip 102. Furthermore, for example, the photodiode 31, the LOG amplifier 32, the buffer 33, and the change detection circuit 34 may be formed in the semiconductor chip 101, and the selector circuit 35 and the bias circuit 36 may be formed in the semiconductor chip 102. Moreover, for example, the photodiode 31, the LOG amplifier 32, the buffer 33, the change detection circuit 34, and the selector circuit 35 may be formed in the semiconductor chip 101, and the bias circuit 36 may be formed in the semiconductor chip 102.

It is to be noted that the effects described in the present specification are merely exemplary and non-limiting, and other effects may also be achieved.

It is to be noted that the present technology may have the following configurations. According to the present technology of the following configurations, it is possible to reduce the pixel size.

(1)

A photodetection device including:
a plurality of pixels each including a light-receiving element, a generation circuit configured to generate a light-receiving signal corresponding to an amount of light received by the light-receiving element, and a change detection circuit configured to detect an amount of a change in the light-receiving signal;
a selector circuit configured to couple one of a plurality of the change detection circuits in the plurality of pixels to a coupling node;
a bias circuit coupled to the coupling node; and
a comparison circuit configured to generate an event signal by comparing a signal in the coupling node and a predetermined threshold with each other.

(2)

The photodetection device according to (1), in which the bias circuit includes a first transistor including a gate and a drain coupled to the coupling node.

(3)

The photodetection device according to (2), further including a control circuit configured to set a voltage of the gate of the first transistor to one of multiple voltages.

(4)

The photodetection device according to (3), in which the selector circuit is configured to sequentially couple one of the plurality of the change detection circuits to the coupling node in a first period, and the control circuit is configured to set, in the first period, the voltage of the gate of the first transistor to an active voltage that brings the bias circuit into an active state, and set, in a period other than the first period, the voltage of the gate of the first transistor to an inactive voltage that brings the bias circuit into an inactive state.

(5)

The photodetection device according to (1), in which
the bias circuit includes
a first transistor including a gate and a drain, the gate being configured to be supplied with a first voltage,
a first switch configured to couple the coupling node and the drain of the first transistor to each other by coming into an ON state,
a second transistor including a gate and a drain, the gate being configured to be supplied with a second voltage, and
a second switch configured to couple the coupling node and the drain of the second transistor to each other by coming into an ON state.

(6)

The photodetection device according to (5), further including a control circuit that controls operations of the first switch and the second switch, in which
in each of a second period and a third period, the selector circuit is configured to sequentially couple one of the plurality of the change detection circuits to the coupling node, and
the control circuit is configured to
bring the first switch into an ON state in the second period and bring the first switch into an OFF state in a period other than the second period, and
bring the second switch into an ON state in the third period and bring the second switch into an OFF state in a period other than the third period.

(7)

The photodetection device according to any one of (1) to (6), in which
the change detection circuit includes
a first capacitor including a first terminal and a second terminal coupled to a first node, the first terminal being configured to be supplied with the light-receiving signal,
a third transistor including a gate coupled to the first node and a drain coupled to a second node, and
a fourth transistor including a drain and a source, one of the drain and the source being coupled to the first node, another of the drain and the source being coupled to the second node, and the second node is configured to be coupled to the bias circuit through the selector circuit.

(8)

The photodetection device according to (7), in which the change detection circuit further includes a second capacitor including a first terminal coupled to the first node and a second terminal coupled to the second node.

(9)

The photodetection device according to (7) or (8), in which the change detection circuit further includes a fifth transistor including a drain and a source, one of the drain and the source being coupled to the first node, another of the drain and the source being coupled to the second node.

(10)

The photodetection device according to any one of (7) to (9), in which the change detection circuit is configured to detect an amount of a change in the light-receiving signal after the fourth transistor is changed from an ON state to an OFF state.

(11)

The photodetection device according to any one of (7) to (10), in which in a second period, one of a plurality of the fourth transistors of the plurality of the change detection circuits in the plurality of pixels is configured to sequentially come into an ON state, and the selector circuit is configured to in the second period, sequentially couple one of a plurality of the second nodes in the plurality of the change detection circuits to the coupling node, and in a third period subsequent to the second period, sequentially couple one of the plurality of the second nodes in the plurality of the change detection circuits to the coupling node.

(12)

The photodetection device according to any one of (1) to (6), in which the change detection circuit includes a first capacitor including a first terminal and a second terminal coupled to a first node, the first terminal being configured to be supplied with the light-receiving signal, a third transistor including a gate coupled to the first node and a drain coupled to a second node, a sixth transistor including a drain and a source, one of the drain and the source being coupled to the first node, another of the drain and the source being coupled to a third node, and a seventh transistor including a drain and a source, one of the drain and the source being coupled to the third node, another of the drain and the source being coupled to the second node, and the second node is configured to be coupled to the bias circuit through the selector circuit.

(13)

The photodetection device according to (12), in which the change detection circuit further includes a second capacitor including a first terminal coupled to the first node and a second terminal coupled to the second node.

(14)

The photodetection device according to any one of (1) to (13), in which a plurality of the light-receiving elements of the plurality of pixels is provided in a first semiconductor chip, and the plurality of the change detection circuits of the plurality of pixels, the selector circuit, the bias circuit, and the comparison circuit are provided in a second semiconductor chip attached to the first semiconductor chip.

(15)

A photodetector including:

an optical system;

a photodetection device configured to detect light incident through the optical system; and an analysis circuit configured to analyze an object to be detected on the basis of a result of detection by the photodetection device, the photodetection device including a plurality of pixels each including a light-receiving element, a generation circuit configured to generate a light-receiving signal corresponding to an amount of light received by the light-receiving element, and a change detection circuit configured to detect an amount of a change in the light-receiving signal, a selector circuit configured to couple one of a plurality of the change detection circuits in the plurality of pixels to a coupling node, a bias circuit coupled to the coupling node, and a comparison circuit configured to generate an event signal by comparing a signal in the coupling node and a predetermined threshold with each other.

The present application claims the benefit of Japanese Priority Patent Application JP2021-138211 filed with the Japan Patent Office on Aug. 26, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photodetection device comprising:

a plurality of pixels each including a light-receiving element, a generation circuit configured to generate a light-receiving signal corresponding to an amount of light received by the light-receiving element, and a change detection circuit configured to detect an amount of a change in the light-receiving signal;

a selector circuit configured to couple one of a plurality of the change detection circuits in the plurality of pixels to a coupling node;

a bias circuit coupled to the coupling node; and a comparison circuit configured to generate an event signal by comparing a signal in the coupling node and a predetermined threshold with each other.

2. The photodetection device according to claim 1, wherein the bias circuit includes a first transistor including a gate and a drain coupled to the coupling node.

3. The photodetection device according to claim 2, further comprising a control circuit configured to set a voltage of the gate of the first transistor to one of multiple voltages.

4. The photodetection device according to claim 3, wherein the selector circuit is configured to sequentially couple one of the plurality of the change detection circuits to the coupling node in a first period, and the control circuit is configured to set, in the first period, the voltage of the gate of the first transistor to an active voltage that brings the bias circuit into an active state, and set, in a period other than the first period, the voltage of the gate of the first transistor to an inactive voltage that brings the bias circuit into an inactive state.

5. The photodetection device according to claim 1, wherein
the bias circuit includes
a first transistor including a gate and a drain, the gate being configured to be supplied with a first voltage,
a first switch configured to couple the coupling node and the drain of the first transistor to each other by coming into an ON state,
a second transistor including a gate and a drain, the gate being configured to be supplied with a second voltage, and
a second switch configured to couple the coupling node and the drain of the second transistor to each other by coming into an ON state.

6. The photodetection device according to claim 5, further comprising a control circuit that controls operations of the first switch and the second switch, wherein
in each of a second period and a third period, the selector circuit is configured to sequentially couple one of the plurality of the change detection circuits to the coupling node, and
the control circuit is configured to
bring the first switch into an ON state in the second period and bring the first switch into an OFF state in a period other than the second period, and
bring the second switch into an ON state in the third period and bring the second switch into an OFF state in a period other than the third period.

7. The photodetection device according to claim 1, wherein
the change detection circuit includes
a first capacitor including a first terminal and a second terminal coupled to a first node, the first terminal being configured to be supplied with the light-receiving signal,
a third transistor including a gate coupled to the first node and a drain coupled to a second node, and
a fourth transistor including a drain and a source, one of the drain and the source being coupled to the first node, another of the drain and the source being coupled to the second node, and
the second node is configured to be coupled to the bias circuit through the selector circuit.

8. The photodetection device according to claim 7, wherein the change detection circuit further includes a second capacitor including a first terminal coupled to the first node and a second terminal coupled to the second node.

9. The photodetection device according to claim 7, wherein the change detection circuit further includes a fifth transistor including a drain and a source, one of the drain and the source being coupled to the first node, another of the drain and the source being coupled to the second node.

10. The photodetection device according to claim 7, wherein the change detection circuit is configured to detect an amount of a change in the light-receiving signal after the fourth transistor is changed from an ON state to an OFF state.

11. The photodetection device according to claim 7, wherein
in a second period, one of a plurality of the fourth transistors of the plurality of the change detection circuits in the plurality of pixels is configured to sequentially come into an ON state, and
the selector circuit is configured to
in the second period, sequentially couple one of a plurality of the second nodes in the plurality of the change detection circuits to the coupling node, and
in a third period subsequent to the second period, sequentially couple one of the plurality of the second nodes in the plurality of the change detection circuits to the coupling node.

12. The photodetection device according to claim 1, wherein
the change detection circuit includes
a first capacitor including a first terminal and a second terminal coupled to a first node, the first terminal being configured to be supplied with the light-receiving signal,
a third transistor including a gate coupled to the first node and a drain coupled to a second node,
a sixth transistor including a drain and a source, one of the drain and the source being coupled to the first node, another of the drain and the source being coupled to a third node, and
a seventh transistor including a drain and a source, one of the drain and the source being coupled to the third node, another of the drain and the source being coupled to the second node, and
the second node is configured to be coupled to the bias circuit through the selector circuit.

13. The photodetection device according to claim 12, wherein the change detection circuit further includes a second capacitor including a first terminal coupled to the first node and a second terminal coupled to the second node.

14. The photodetection device according to claim 1, wherein
a plurality of the light-receiving elements of the plurality of pixels is provided in a first semiconductor chip, and
the plurality of the change detection circuits of the plurality of pixels, the selector circuit, the bias circuit, and the comparison circuit are provided in a second semiconductor chip attached to the first semiconductor chip.

15. A photodetector comprising:
an optical system;
a photodetection device configured to detect light incident through the optical system; and
an analysis circuit configured to analyze an object to be detected on a basis of a result of detection by the photodetection device,
the photodetection device including
a plurality of pixels each including a light-receiving element, a generation circuit configured to generate a light-receiving signal corresponding to an amount of light received by the light-receiving element, and a change detection circuit configured to detect an amount of a change in the light-receiving signal,
a selector circuit configured to couple one of a plurality of the change detection circuits in the plurality of pixels to a coupling node,
a bias circuit coupled to the coupling node, and
a comparison circuit configured to generate an event signal by comparing a signal in the coupling node and a predetermined threshold with each other.

16. The photodetector according to claim 15, wherein the bias circuit includes a first transistor including a gate and a drain coupled to the coupling node.

17. The photodetector according to claim 16, further comprising a control circuit configured to set a voltage of the gate of the first transistor to one of multiple voltages.

18. The photodetector according to claim 17, wherein
the selector circuit is configured to sequentially couple one of the plurality of the change detection circuits to the coupling node in a first period, and
the control circuit is configured to
set, in the first period, the voltage of the gate of the first transistor to an active voltage that brings the bias circuit into an active state, and
set, in a period other than the first period, the voltage of the gate of the first transistor to an inactive voltage that brings the bias circuit into an inactive state.

19. The photodetector according to claim 15, wherein
the change detection circuit includes
a first capacitor including a first terminal and a second terminal coupled to a first node, the first terminal being configured to be supplied with the light-receiving signal,
a third transistor including a gate coupled to the first node and a drain coupled to a second node, and
a fourth transistor including a drain and a source, one of the drain and the source being coupled to the first node, another of the drain and the source being coupled to the second node, and
the second node is configured to be coupled to the bias circuit through the selector circuit.

20. The photodetector according to claim 15, wherein
the change detection circuit includes
a first capacitor including a first terminal and a second terminal coupled to a first node, the first terminal being configured to be supplied with the light-receiving signal,
a third transistor including a gate coupled to the first node and a drain coupled to a second node,
a sixth transistor including a drain and a source, one of the drain and the source being coupled to the first node, another of the drain and the source being coupled to a third node, and
a seventh transistor including a drain and a source, one of the drain and the source being coupled to the third node, another of the drain and the source being coupled to the second node, and
the second node is configured to be coupled to the bias circuit through the selector circuit.

\* \* \* \* \*